(12) United States Patent
Shichijo et al.

(10) Patent No.: US 12,264,791 B2
(45) Date of Patent: Apr. 1, 2025

(54) LIGHT-EMITTING DEVICE

(71) Applicant: NICHIA CORPORATION, Anan (JP)

(72) Inventors: Satoshi Shichijo, Tokushima (JP);
Tatsuya Hayashi, Tokushima (JP);
Yusuke Hayashi, Anan (JP); Masahiro Okazaki, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/625,067

(22) Filed: Apr. 2, 2024

(65) Prior Publication Data
US 2024/0247769 A1 Jul. 25, 2024

Related U.S. Application Data

(63) Continuation of application No. 18/352,571, filed on Jul. 14, 2023, now Pat. No. 12,013,089.

(30) Foreign Application Priority Data

Jul. 21, 2022 (JP) .................................. 2022-116500
Nov. 30, 2022 (JP) .................................. 2022-192240
Apr. 18, 2023 (JP) .................................. 2023-067600

(51) Int. Cl.
*F21K 9/64* (2016.01)
*F21K 9/68* (2016.01)
(Continued)

(52) U.S. Cl.
CPC .................. *F21K 9/64* (2016.08); *F21K 9/68* (2016.08); *F21S 41/176* (2018.01); *F21Y 2115/10* (2016.08)

(58) Field of Classification Search
CPC .............. F21K 9/64; F21K 9/68; F21S 41/176
(Continued)

(56) References Cited

U.S. PATENT DOCUMENTS 10,770,630 B2 * 9/2020 Miyoshi ................ H01L 27/153
11,152,546 B2 10/2021 Oka et al.
(Continued)

FOREIGN PATENT DOCUMENTS

JP 2005019874 A 1/2005
JP 2009-266434 A 11/2009
(Continued)

*Primary Examiner* — Bryon T Gyllstrom
(74) *Attorney, Agent, or Firm* — Global IP Counselors, LLP

(57) ABSTRACT

A light-emitting device includes a light-emitting element, a light-transmissive member, and a first light adjustment member. The light-transmissive member has a first upper surface, a second upper surface, a lower surface facing a first surface of a support substrate of the light-emitting element, a first lateral surface contiguous with the first upper surface and the second upper surface, a second lateral surface contiguous with the second upper surface and the lower surface, and a third lateral surface contiguous with the first upper surface and the lower surface. The first light adjustment member exposes the first upper surface of the light-transmissive member and covers the second upper surface and the first lateral surface of the light-transmissive member. The light-transmissive member and the first light adjustment member collectively define a rectangular cross-sectional shape.

14 Claims, 17 Drawing Sheets

(51) Int. Cl.
*F21S 41/176* (2018.01)
*F21Y 115/10* (2016.01)

(58) Field of Classification Search
USPC ........................................................ 362/510
See application file for complete search history.

(56) References Cited

U.S. PATENT DOCUMENTS

| | | | |
|---|---|---|---|
| 11,152,546 B2* | 10/2021 | Oka | H01L 33/505 |
| 11,367,818 B2* | 6/2022 | Yamaoka | G02F 1/133603 |
| 11,391,884 B2* | 7/2022 | Yamaoka | H01L 33/486 |
| 2011/0026266 A1 | 2/2011 | Sasaki et al. | |
| 2013/0100692 A1 | 4/2013 | Yokobayashi | |
| 2016/0372515 A1 | 12/2016 | Miyoshi et al. | |
| 2017/0155022 A1* | 6/2017 | Tomonari | H01L 33/647 |
| 2017/0365746 A1 | 12/2017 | Vampola et al. | |
| 2019/0067536 A1 | 2/2019 | Oka et al. | |
| 2019/0103526 A1* | 4/2019 | Miyoshi | H01L 27/153 |
| 2019/0154236 A1* | 5/2019 | Ozeki | F21V 9/32 |
| 2020/0083414 A1 | 3/2020 | Tomonari et al. | |
| 2020/0127179 A1* | 4/2020 | Nakai | H01L 33/62 |
| 2020/0348007 A1 | 11/2020 | Ozeki et al. | |
| 2020/0357961 A1 | 11/2020 | Miyoshi | |
| 2021/0151644 A1 | 5/2021 | Tomonari et al. | |
| 2021/0359172 A1 | 11/2021 | Oka et al. | |
| 2021/0384375 A1* | 12/2021 | Sakamoto | H01L 33/505 |
| 2022/0045246 A1 | 2/2022 | Miyoshi | |
| 2023/0223502 A1 | 7/2023 | Oka et al. | |

FOREIGN PATENT DOCUMENTS

| | | |
|---|---|---|
| JP | 2013089814 A | 5/2013 |
| JP | 2017-011259 A | 1/2017 |
| JP | 2017-108091 A | 6/2017 |
| JP | 2019041044 A | 3/2019 |
| JP | 2019-067905 A | 4/2019 |
| JP | 2019-096675 A | 6/2019 |
| JP | 2020-065001 A | 4/2020 |
| JP | 2020-188183 A | 11/2020 |
| JP | 2021-036621 A | 3/2021 |
| JP | 2021-197542 A | 12/2021 |

* cited by examiner

LIGHT-EMITTING DEVICE

CROSS-REFERENCE TO RELATED APPLICATION

This application is a continuation application of U.S. patent application Ser. No. 18/352,571 filed on Jul. 14, 2023. This application claims priority to Japanese Patent Application No. 2022-116500 filed on Jul. 21, 2022, Japanese Patent Application No. 2022-192240 filed on Nov. 30, 2022, and Japanese Patent Application No. 2023-067600, filed on Apr. 18, 2023. The entire disclosures of U.S. patent application Ser. No. 18/352,571 and Japanese Patent Application Nos. 2022-116500, 2022-192240 and 2023-067600 are hereby incorporated herein by reference.

The present disclosure relates to a light-emitting device.

In recent years, LEDs have been used as light sources for vehicle lamps such as headlights. For example, Japanese Patent Publication No. 2017-011259 discloses a light-emitting device having a light distribution suitable for a headlight by including a combination of a plurality of light-emitting elements with different areas (dimensions).

SUMMARY

An object of the present disclosure is to provide a light-emitting device including a high luminance region in a light-emitting surface.

A light-emitting device according to an embodiment of the present disclosure includes a light-emitting element, a light-transmissive member, and a first light adjustment member. The light-emitting element includes a support substrate having a first surface and a second surface located on a side opposite to the first surface, and a light-emitting portion located on the second surface of the support substrate and including a semiconductor layered body including a first semiconductor layer, a light-emitting layer and a second semiconductor layer in this sequence. The light-transmissive member has a first upper surface, a second upper surface, a lower surface located on a side opposite to the first upper surface and the second upper surface, and facing the first surface of the support substrate of the light-emitting element, a first lateral surface contiguous with the first upper surface and the second upper surface, a second lateral surface contiguous with the second upper surface and the lower surface, and a third lateral surface contiguous with the first upper surface and the lower surface. The first light adjustment member exposes the first upper surface of the light-transmissive member and covers the second upper surface and the first lateral surface of the light-transmissive member. The light-transmissive member and the first light adjustment member collectively define a rectangular cross-sectional shape.

According to embodiments of the present disclosure, it is possible to provide a light-emitting device including a high luminance region in a light-emitting surface.

BRIEF OF DESCRIPTION OF DRAWINGS

EMBODIMENTS

Figure 1A:
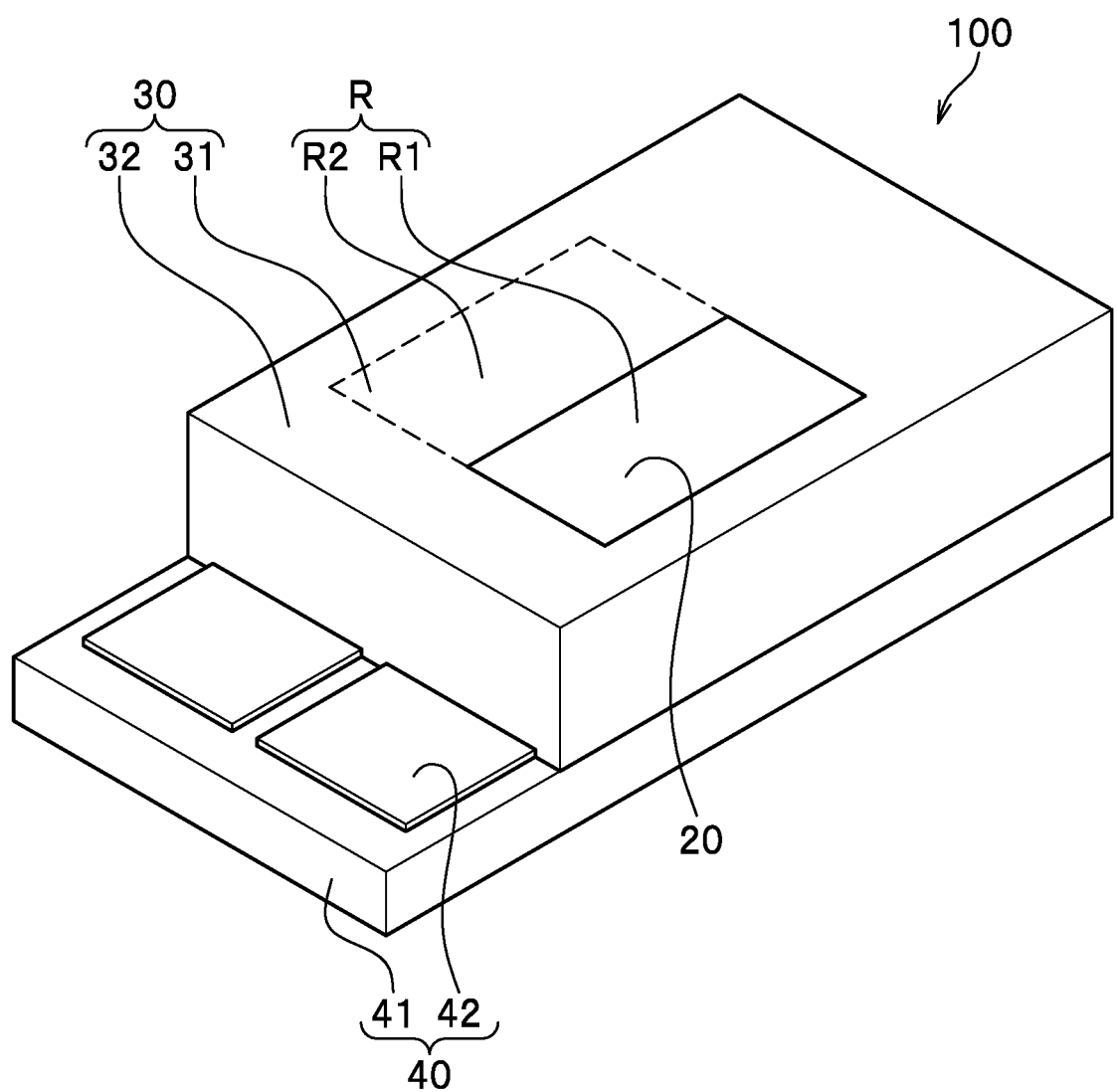
FIG. 1A is a schematic perspective view illustrating a light-emitting device according to a first embodiment.

Embodiments will be described below with reference to the drawings. The following embodiments are examples of light-emitting devices and methods for manufacturing the light-emitting devices to embody the technical concept of the present embodiment, and the present embodiment is not limited to the embodiments described below. In addition, dimensions, materials, shapes, relative arrangements, or the like of components described in the embodiments are not intended to limit the scope of the present invention thereto, unless otherwise specified, and are merely exemplary. Note that, sizes, positional relationship, and the like of members illustrated in the drawings can be exaggerated or simplified for clarity of description. To avoid overcomplicating the drawings, some elements are not shown or end views illustrating only cut surfaces may be used as sectional views. Furthermore, "covering" is not limited to cases of direct contact, but also includes cases of indirectly covering a member, for example, via another member. Moreover, "covering a surface" includes the surface being covered entirely or partially. Furthermore, "disposing" is not limited to cases of direct contact, but also includes cases of indirectly disposing a member, for example, via another member. Note that "plan view" as used in the present specification means observation from the side of an upper surface, which is a light-emitting surface of a light-emitting device.

First Embodiment

Light-Emitting Device

Figure 1B:
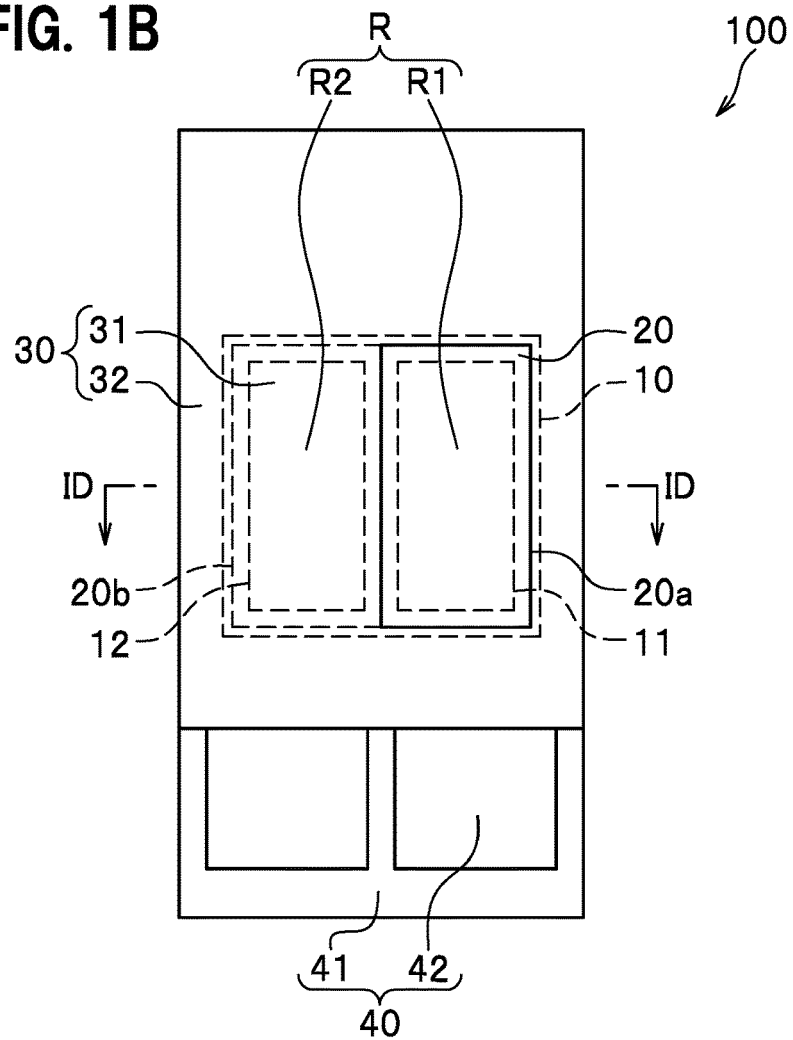
FIG. 1B is a schematic plan view illustrating the light-emitting device according to the first embodiment.
Figure 1C:
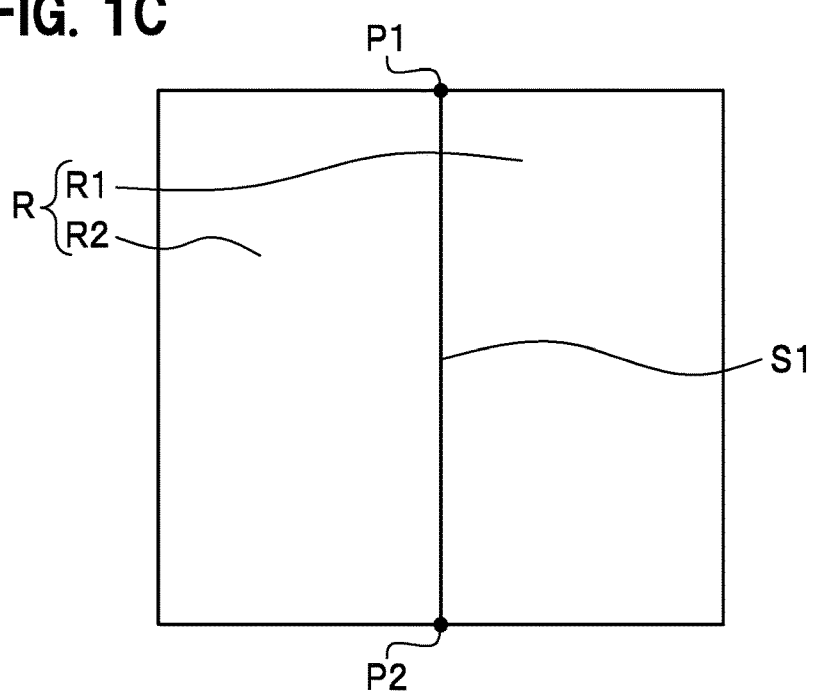
FIG. 1C is a schematic plan view for showing a shape of a light-emitting region of the light-emitting device according to the first embodiment.
Figure 1D:
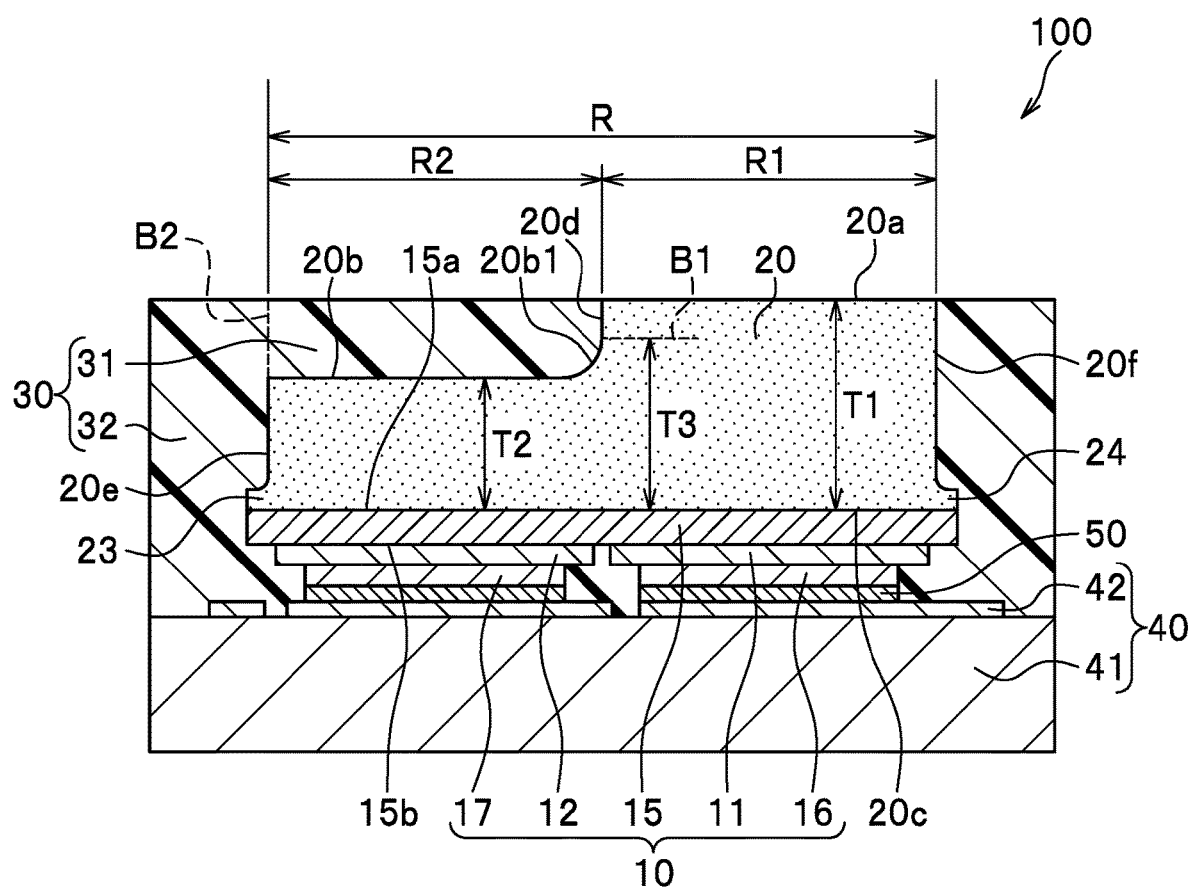
FIG. 1D is a schematic sectional view illustrating a cross-section taken along a line ID-ID of FIG. 1B.
Figure 1E:
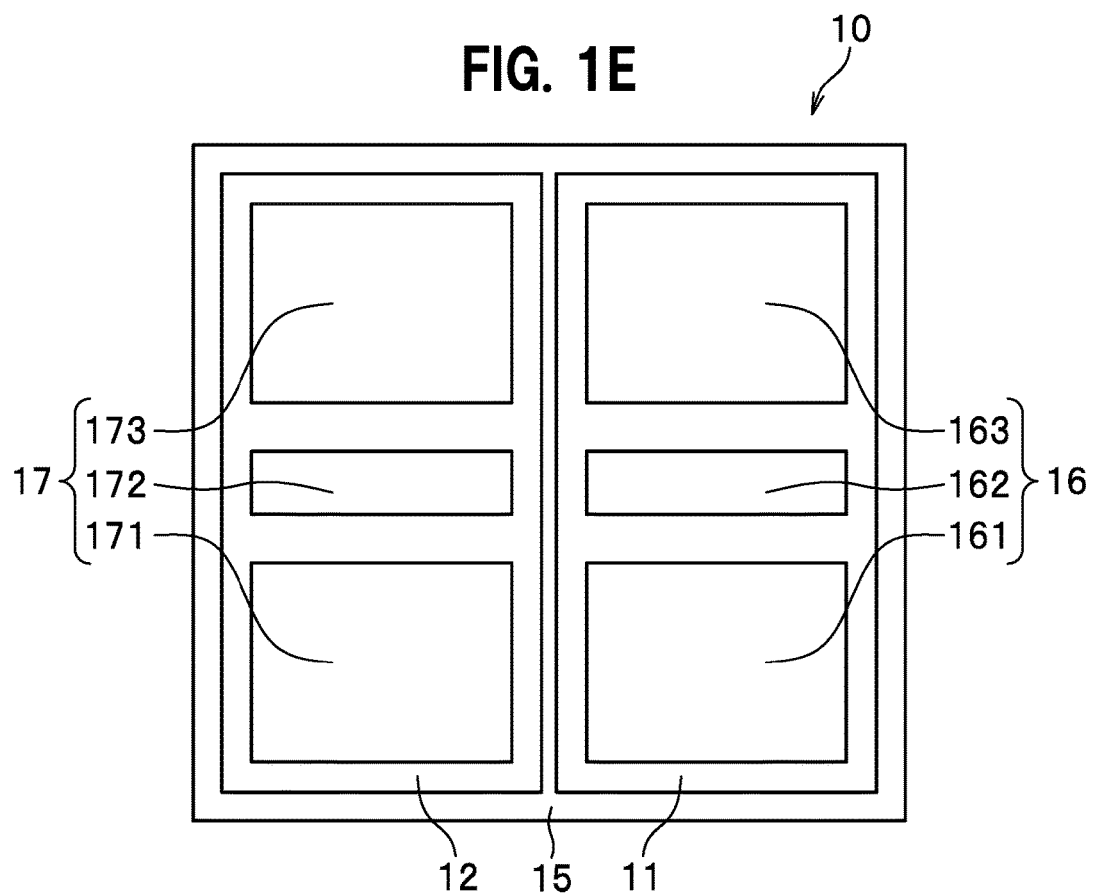
FIG. 1E is a schematic bottom view illustrating a light-emitting element of the light-emitting device according to the first embodiment.
Figure 1F:
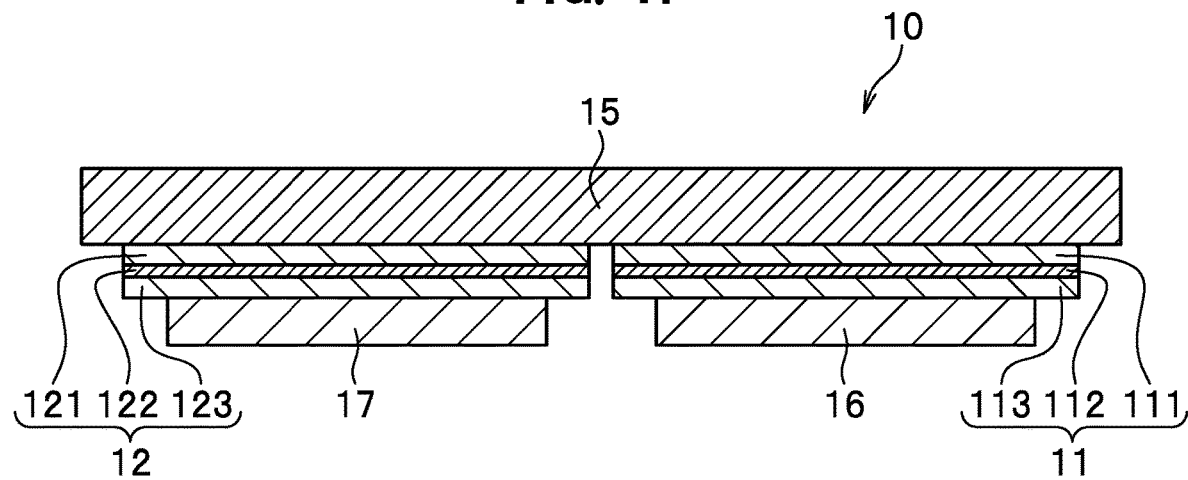
FIG. 1F is a schematic sectional view illustrating the light-emitting element of the light-emitting device according to the first embodiment.
Figure 1G:
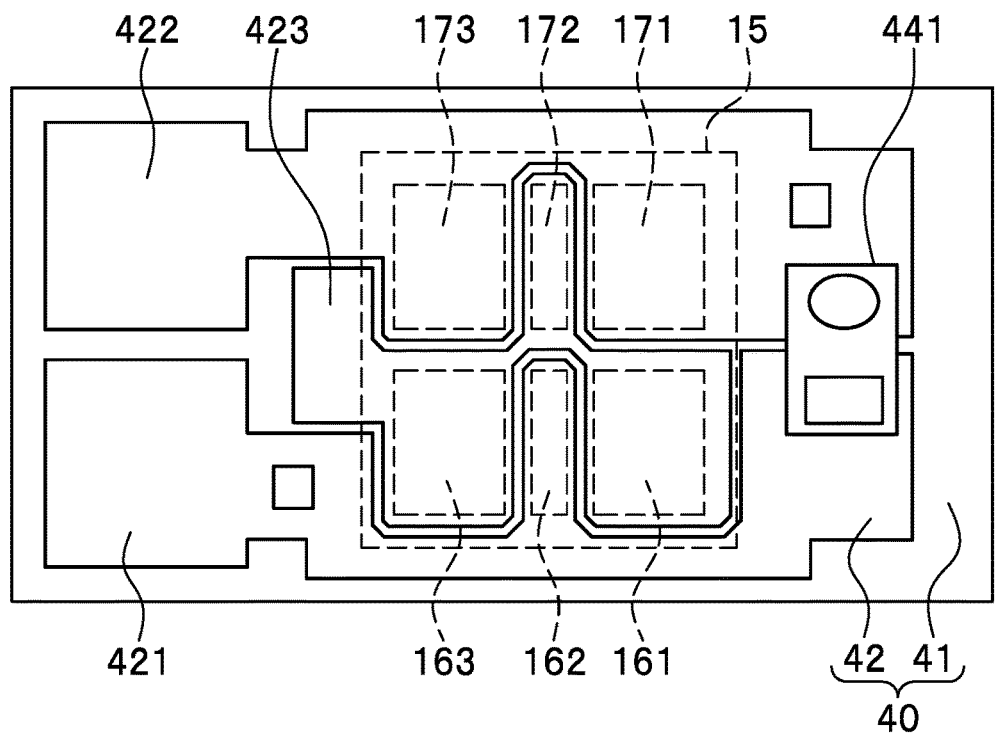
FIG. 1G is a schematic plan view for showing a wiring substrate of the light-emitting device according to the first embodiment.
Figure 1H:
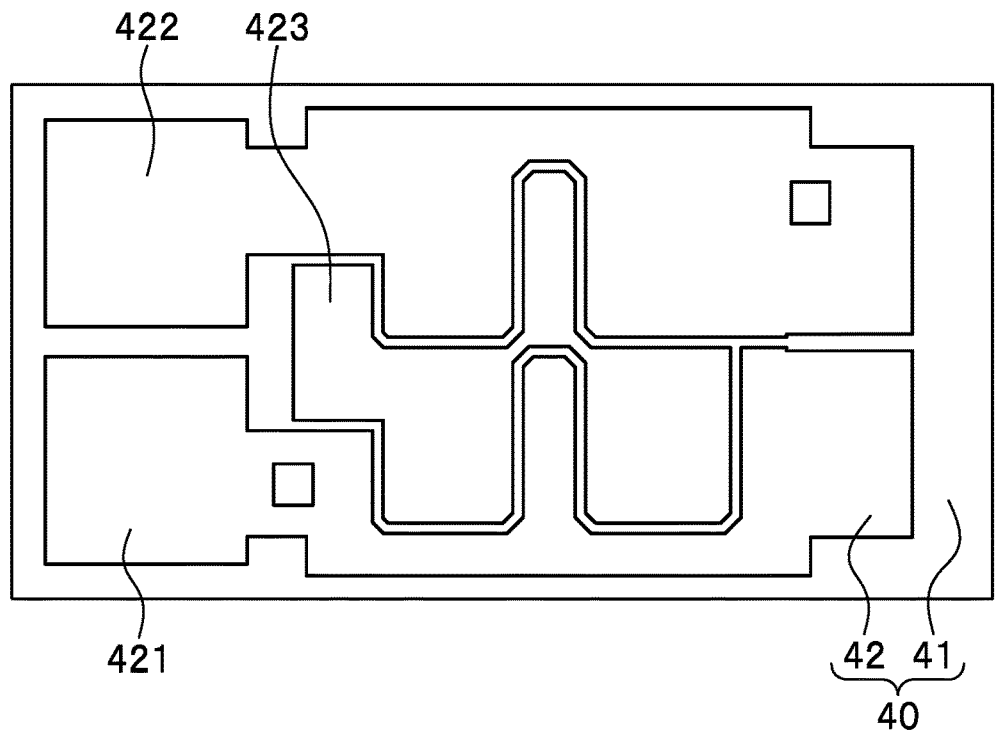
FIG. 1H is a schematic plan view illustrating the wiring substrate of the light-emitting device according to the first embodiment.
Figure 2:
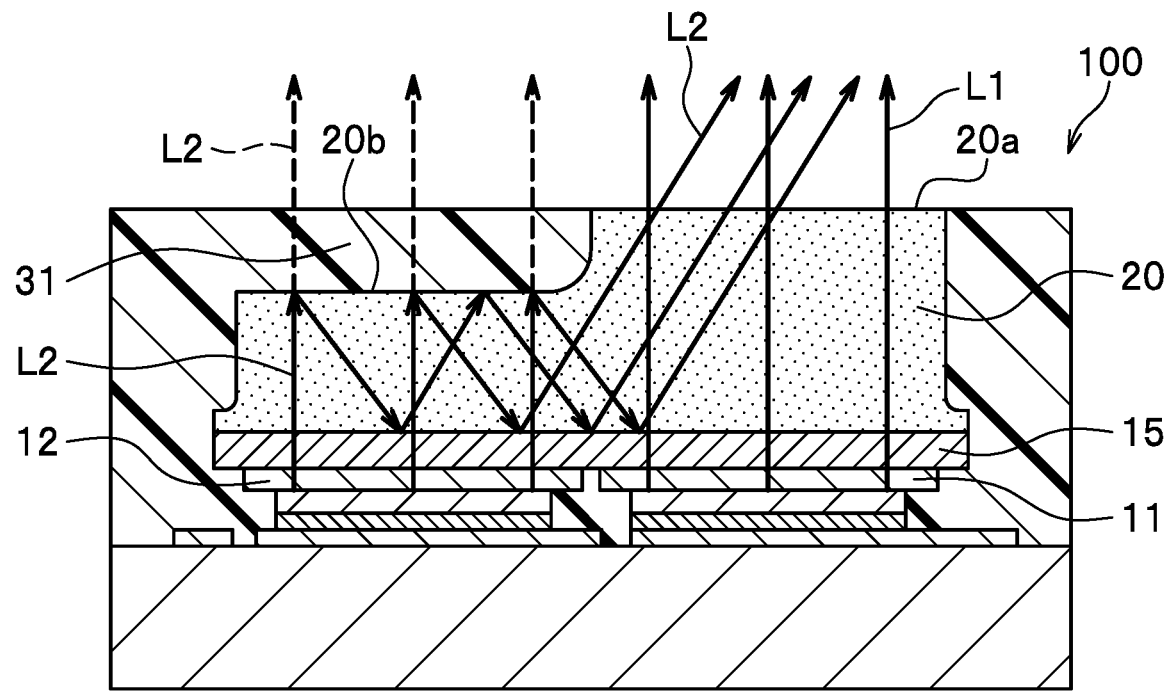
FIG. 2 is a schematic sectional view illustrating a light path from a light-emitting portion of the light-emitting device according to the first embodiment.

FIG. 1A is a schematic perspective view illustrating a light-emitting device according to a first embodiment. FIG. 1B is a schematic plan view illustrating the light-emitting device according to the first embodiment. FIG. 1C is a schematic plan view for showing a shape of a light-emitting region of the light-emitting device according to the first embodiment. FIG. 1D is a schematic sectional view illustrating a cross-section taken along a line ID-ID of FIG. 1B. FIG. 1E is a schematic bottom view illustrating a light-emitting element of the light-emitting device according to the first embodiment. FIG. 1F is a schematic sectional view illustrating the light-emitting element of the light-emitting device according to the first embodiment. FIG. 1G is a schematic plan view for showing a wiring substrate of the light-emitting device according to the first embodiment. FIG. 1H is a schematic plan view illustrating the wiring substrate of the light-emitting device according to the first embodiment. FIG. 2 is a schematic sectional view illustrating a light path from a light-emitting portion of the light-emitting device according to the first embodiment.

A light-emitting device 100 includes, on an upper surface, a light-emitting region R including a first light-emitting region R1 and a second light-emitting region R2 disposed next to the first light-emitting region R1. The light-emitting device 100 includes at least a light-emitting element 10, a light-transmissive member 20, and a light adjustment member 30. Specifically, the light-emitting element 10 includes a support substrate 15 including a first surface 15a and a second surface 15b located on the side opposite to the first surface 15a, and light-emitting portions 11 and 12 located on the second surface 15b of the support substrate 15, the light-emitting portion 11 including a semiconductor layered body including a first semiconductor layer 111, a light-emitting layer 112, and a second semiconductor layer 113 in this sequence, and the light-emitting portion 12 including a semiconductor layered body including a first semiconductor layer 121, a light-emitting layer 122, and a second semiconductor layer 123 in this sequence. The light-transmissive member 20 has a first upper surface 20a, a second upper surface 20b, a lower surface 20c located on the side opposite to the first upper surface 20a and the second upper surface 20b, a first lateral surface 20d contiguous with the first upper surface 20a and the second upper surface 20b, a second lateral surface 20e contiguous with the second upper surface 20b and the lower surface 20c, and a third lateral surface 20f contiguous with the first upper surface 20a and the lower surface 20c. The light adjustment member 31 that exposes the first upper surface 20a of the light-transmissive member 20 and covers the second upper surface 20b and the first lateral surface 20d. The light-transmissive member 20 has a thickness T1 from the lower surface 20c to the first upper surface 20a larger than a thickness T2 from the lower surface 20c to the second upper surface 20b. The lower surface 20c of the light-transmissive member 20 faces the first surface 15a of the support substrate 15.

In plan view, the first light-emitting region R1 has the first upper surface 20a, the second light-emitting region R2 has the second upper surface 20b, the area of the second light-emitting region R2 is in a range from 35% to 95% of an area of the light-emitting region R. The boundary between the first light-emitting region R1 and the second light-emitting region R2 includes a first point P1 and a second point P2 on the perimeter of the light-emitting region R, and a straight line S1 connecting the first point P1 and the second point P2 is a straight line extending across the light-emitting region R in plan view.

In the light-emitting device 100, the first upper surface 20a of the light-transmissive member 20 serving as the light-emitting surface of the first light-emitting region R1 and the upper surface of the light adjustment member 31 serving as the light-emitting surface of the second light-emitting region R2 configure portions of the upper surface of the light-emitting device 100. In the light-emitting device 100, the boundary between the first light-emitting region R1 and the second light-emitting region R2 in the light-emitting region R is the outer edge of the first upper surface 20a contiguous with the first lateral surface 20d of the light-transmissive member 20. In the light-emitting device 100 having the above-described configuration, the luminance of the light emitted from the first light-emitting region R1 can be higher than the luminance of the light emitted from the second light-emitting region R2. In this manner, the light-emitting device 100 can include a high luminance region in the light-emitting surface.

As an example, in the following description, the light-emitting device 100 further includes a wiring substrate 40 on which the light-emitting element 10 is disposed. A light-emitting region and each component of the light-emitting device 100 are described below.

Light-Emitting Region

The light-emitting device 100 includes, on the upper surface, the light-emitting region R including the first light-emitting region R1 and the second light-emitting region R2 next to the first light-emitting region R1 as the light-emitting surface of the light-emitting device 100. Specifically, the light-emitting device 100 includes the light-emitting region R on the upper surface, and the light-emitting region R is divided into two regions with different luminances by the boundary between the first light-emitting region R1 and the second light-emitting region R2. The luminance of the first light-emitting region R1 is higher than the luminance of the second light-emitting region R2. Note that the luminance of the first light-emitting region R1 higher than the luminance of the second light-emitting region R2 means that when the light-emitting device 100 emits light, the average luminance of the entire first light-emitting region R1 is higher than the average luminance of the entire second light-emitting region R2.

In plan view, each of the first light-emitting region R1 and the second light-emitting region R2 includes a region overlapping the light-emitting element 10 and includes a region overlapping the light-transmissive member 20.

In plan view, the first light-emitting region R1 includes the first upper surface 20a, and the second light-emitting region R2 includes the second upper surface 20b. In the present embodiment, in plan view, the first light-emitting region R1 overlaps the first upper surface 20a, and the second light-emitting region R2 overlaps the second upper surface 20b. Note that in plan view, a part of the first light-emitting region R1 may include a part not overlapping the first upper surface 20a, and a part of the second light-emitting region R2 may include a part not overlapping the second upper surface 20b. The boundary between the first light-emitting region R1 and the second light-emitting region R2 includes the first point P1 and the second point P2 both on the perimeter of the light-emitting region R, and the straight line S1 connecting first point P1 and the second point P2 is a straight line extending across the light-emitting region R in plan view. In the present disclosure, the straight line extending across the light-emitting region R is a straight line that divides the light-emitting region R into two regions, which does not include a straight line not overlapping the light-emitting region R in plan view, such as a straight line overlapping the perimeter of the light-emitting region R.

In this case, the boundary between the first light-emitting region R1 and the second light-emitting region R2 is one straight line S1 connecting the first point P1 and the second point P2. Specifically, in the light-emitting device 100, the boundary between the first light-emitting region R1 and the second light-emitting region R2 coincide with one straight line S1 connecting the first point P1 and the second point P2, where the boundary and the perimeter of the light-emitting region R meet, in plan view.

In this manner, in the light-emitting device 100, the light-emitting region R located on the upper surface is divided into two regions with different luminances by the boundary extending across the light-emitting region R. Specifically, in the light-emitting device 100, a high luminance region (i.e., the first light-emitting region R1) and a low luminance region (i.e., the second light-emitting region R2) are disposed next to each other in the light-emitting region R, and parts of the outer edges of the regions configure the outer edge of the light-emitting region R. Thus, for example, in the case in which the light-emitting device 100 is used for a light source of a vehicle headlight, the light-emitting device 100 can be suitable for formation of the cutoff line and formation of the desired light distribution suitable for low beams and high beams.

The area ratio between the first light-emitting region R1 and the second light-emitting region R2 in the light-emitting region R may be set as necessary in accordance with the desired light distribution.

Preferably, in plan view, the area of the second light-emitting region R2 is in a range from 35% to 95% of the area of the light-emitting region R. In that case, the light-emitting device 100 can include a high luminance region in the light-emitting surface. For example, by setting the area of the second light-emitting region R2 in a range from 35% to 75% of the area of the light-emitting region R, the light-emitting device that includes a high luminance region in the vicinity of the outer edge of the light-emitting region R while suppressing the reduction of the light emission efficiency of the entire light-emitting region R can be obtained. Further, by setting the area of the second light-emitting region R2 in a range from 75% to 95% of the area of the light-emitting region R, the luminance difference between the low luminance region and the high luminance region in the light-emitting region R of the light-emitting device 100 can be increased, and the high luminance region can be locally positioned in a part of the outer edge of an emission region.

The luminance difference between the first light-emitting region R1 and the second light-emitting region R2 in the light-emitting region R may be set as necessary in accordance with the desired light distribution. Note that the greater the ratio of the second light-emitting region R2 in the light-emitting region R, the more the luminance of the first light-emitting region R1 can be increased relative to the luminance of the second light-emitting region R2.

For example, when the second light-emitting region R2 has the above-described area ratio with respect to the light-emitting region R in the light-emitting device 100, the luminance of the second light-emitting region R2 can be set in a range from 5% to 80% of the luminance of the first light-emitting region R1.

For example, the light-emitting device in which the area of the second light-emitting region R2 is in a range from 35% to 75% of the area of the light-emitting region R is suitable for setting the average luminance of the second light-emitting region R2 in a range from 20% to 95% of the average luminance of the first light-emitting region R1. Further, the light-emitting device in which the area of the second light-emitting region R2 is in a range from 75% to 95% of the light-emitting region R is suitable for setting the average luminance of the second light-emitting region R2 in a range from 5% to 20% of the average luminance of the first light-emitting region R1.

In the present embodiment, to obtain the light-emitting device 100 including the first light-emitting region R1 and the second light-emitting region R2 having a luminance difference as described above, the thickness of the light-transmissive member 20 located in the second light-emitting region R2 in plan view (i.e., the shortest distance from the lower surface 20c to the second upper surface 20b) is smaller than the thickness of the light-transmissive member 20 located in the first light-emitting region R1 in plan view (i.e., the shortest distance from the lower surface 20c to the first upper surface 20a). Further, the light adjustment member 31 is disposed on the upper surface) of the light-transmissive member 20 located in the second light-emitting region R2 (i.e., the second upper surface 20b in plan view. The light adjustment member 31 is an optical member with reflective and light-transmissive optical properties. With the light adjustment member 31 covering the second upper surface 20b in the light-emitting device 100, a part of light emitted from the second upper surface 20b can be reflected, the reflected light can be guided to the first light-emitting region R1 side, and I guided light can exit the first upper surface 20a. In this manner, the light-emitting device 100 can include a high luminance region in the first light-emitting region R1 of the light-emitting region R.

Further, because the light-emitting region R of the light-emitting device 100 includes the first light-emitting region R1 and the second light-emitting region R2 having a luminance difference, a high luminance region can be provided in a desired region of the irradiated region in the case in which the light-emitting device 100 is used for a headlight of a vehicle, for example. That is, because the desired light distribution can be obtained without using complex optical designs such as reflectors and lenses, the size of the headlight can be reduced, and the design of the headlight can be further enhanced.

Light-Emitting Element

The light-emitting element 10 includes the support substrate 15 including the first surface 15a and the second surface 15b located on the side opposite to the first surface 15a, and a light-emitting portion disposed on the second surface 15b of the support substrate 15 and including a semiconductor layered body including a first semiconductor layer, a light-emitting layer and a second semiconductor layer in sequence. The light-emitting element 10 may include a plurality of light-emitting portions, and in this case the light-emitting element 10 includes a first light-emitting portion 11 and a second light-emitting portion 12 spaced apart from each other on the second surface 15b of the support substrate 15. Specifically, the light-emitting element 10 includes the support substrate 15, the first light-emitting portion 11 and the second light-emitting portion 12 disposed adjacent to each other on the second surface 15b of the support substrate 15, a first element electrode 16 disposed on the first light-emitting portion 11, and a second element electrode 17 disposed on the second light-emitting portion 12. The first light is emitted from the first light-emitting portion 11 of the light-emitting element 10, and the second light is emitted from the second light-emitting portion 12 of the light-emitting element 10.

Examples of the support substrate 15 include an insulating substrate formed of sapphire, spinel ($MgAl_2O_4$), or the like, and a nitride-based semiconductor substrate formed of InN, AlN, GaN, InGaN, AlGaN, InGaAlN, or the like. Preferably, the support substrate 15 is formed of a light-transmissive material such that light emitted from the light-emitting portions is extracted through the support substrate 15.

Each of the first light-emitting portion 11 and the second light-emitting portion 12 includes the semiconductor layered body. The semiconductor layered body of the first light-emitting portion 11 includes the first semiconductor layer 111, the light-emitting layer 112, and the second semiconductor layer 113 disposed in this order on the support substrate 15. The semiconductor layered body of the second light-emitting portion 12 includes the first semiconductor layer 121, the light-emitting layer 122, and the second semiconductor layer 123 disposed in this order on the support substrate 15. A buffer layer formed of AlGaN or the like may be provided between the support substrate 15 and the semiconductor layered bodies. The first light-emitting portion 11 and the second light-emitting portion 12 are disposed adjacent to each other with a gap therebetween on the second surface 15b of the support substrate 15. An element electrode for supplying the power from the outside is disposed on the surface of each of the first light-emitting portion 11 and the second light-emitting portion 12 on the side opposite to the support substrate 15. On the first light-emitting portion 11, three element electrodes of an N-side electrode 161, a P-side electrode 162, and an N-side electrode 163 are disposed as the first element electrode 16. Similarly, on the second light-emitting portion 12, three element electrodes of an N-side electrode 171, a P-side electrode 172, and an N-side electrode 173 are disposed as the second element electrode 17. In the light-emitting element 10, the first light-emitting portion 11 and the second light-emitting portion 12 are spaced apart and electrically independent from each other.

For the first light-emitting portion 11 and the second light-emitting portion 12, materials that emit light of given wavelengths may be selected. For example, the first light-emitting portion 11 and/or the second light-emitting portion 12 that emit blue light (for example, with a wavelength in a range from 430 nm to 500 nm) and green light (for example, with a wavelength in a range from 500 nm to 570 nm) can use the semiconductor layered body formed using a nitride-based semiconductor ($In_XAl_YGa_{1-X-Y}N$, $0 \leq X$, $0 \leq Y$, $X+Y \leq 1$), GaP, or the like. Also, for example of the first light-emitting portion 11 and/or the second light-emitting portion 12 that emit red light (for example, with a wavelength in a range from 610 nm to 700 nm) can use the semiconductor layered body formed using GaAlAs, AlInGaP, or the like as well as a nitride-based semiconductor. The first light-emitting portion 11 and the second light-emitting portion 12 may have the same semiconductor layered structure or different semiconductor layered structures. The area of the first light-emitting portion 11 and the second light-emitting portion 12 may have the same area (dimensions) or different areas (dimensions) in plan view.

A larger amount of current can be applied to the light-emitting element 10 by connecting the first light-emitting portion 11 and the second light-emitting portion 12 in series, and thus the light-emitting element 10 with a higher output can be obtained. Preferably, in the case in which the light-emitting element 10 includes the first light-emitting portion 11 and the second light-emitting portion 12 disposed next to each other, the boundary between the first light-emitting region R1 and the second light-emitting region R2 is located between the plurality of light-emitting portions 11 and 12 in plan view. In the light-emitting element 10 including the plurality of light-emitting portions, the light-emitting layers 112 and 122 are not disposed between the light-emitting portions 11 and 12. That is, the light-emitting element 10 includes a non-light-emitting region between the light-emitting portions 11 and 12. In this case, in some situations the luminance of the region immediately above the non-light-emitting region on the first surface 15a of the support substrate 15 is lower than that in the region immediately above the light-emitting portions 11 and 12. In view of this, by providing, between the first light-emitting region R1 and the second light-emitting region R2, the non-light-emitting region between the light-emitting portions 11 and 12, the unevenness in light emission in the light-emitting region R can be suppressed.

Light-Transmissive Member

The light-emitting device 100 includes the light-transmissive member 20 with the lower surface 20c facing the first surface 15a of the support substrate 15. Examples of the planar shape of the light-transmissive member 20 include various shapes such as a circular shape, an elliptical shape, a quadrangular shape, and a hexagonal shape. In particular, quadrilateral shapes such as a square shape and a rectangular shape are preferable. In this case, the light-transmissive member 20 has a rectangular planar shape as an example.

The light-transmissive member 20 includes the first upper surface 20a, the second upper surface 20b, the lower surface 20c, the first lateral surface 20d, the second lateral surface 20e, and the third lateral surface 20f. The first lateral surface 20d is located between the first upper surface 20a and the second upper surface 20b.

In the light-transmissive member 20, the planar shape of the entire upper surface including the first upper surface 20a and the second upper surface 20b is a quadrilateral shape, and the outer edge of this quadrilateral overlaps the outer edge of the light-emitting region R of the light-emitting device 100 in plan view. In addition, in the light-transmissive member 20, the outer edge of the first upper surface 20a contiguous with the first lateral surface 20d configures the boundary between the first light-emitting region R1 and the second light-emitting region R2.

Specifically, the outer edge of the first upper surface 20a contiguous with the first lateral surface 20d includes the first point P1 and the second point P2 on the perimeter of the light-emitting region R, and the straight line connecting the first point P1 and the second point P2 overlaps the boundary between the first light-emitting region R1 and the second light-emitting region R2. In this case, the first point P1 and the second point P2 are respectively on the opposite two sides of the quadrilateral shape of the light-transmissive member 20. In this manner, the first light-emitting region R1 and the second light-emitting region R2 can be located on the left and right sides or upper and lower sides of the emission region, and thus ease of lens design for obtaining the desired light distribution is increased in the case in which the light-emitting device 100 is used as a light source of a headlight, for example.

The first lateral surface 20d and the second upper surface 20b may be flat surfaces perpendicularly contiguous with each other, or the first lateral surface 20d and/or the second upper surface 20b may include an inclined surface and may be contiguous with each other through the inclined surface. Preferably, the first lateral surface 20d and/or the second upper surface 20b include an inclined surface so as to be contiguous through the inclined surface. In this case, the second upper surface 20b includes a curved surface portion 20b1 as an inclined surface between the second upper surface 20b and the first lateral surface 20d. This makes it easier to propagate the light on the second light-emitting region R2 side to the first light-emitting region R1 side, and increase the luminance of the first light-emitting region R1. The curved surface portion 20b1 is formed in a recessed shape recessed to the light-transmissive member 20 side. The curvature radius of the curved surface portion 20b1 is in a range from 5 µm to 35 µm, for example.

Note that the boundary between the second upper surface 20b and the first lateral surface 20d is a position in contact with the curved surface portion 20b1 on the first lateral surface 20d (a broken line B1 in FIG. 1D). The boundary between the second upper surface 20b and the first lateral surface 20d need not be clear. Preferably, the third lateral surface 20f and the first lateral surface 20d contiguous with the first upper surface 20a each include a flat surface perpendicularly contiguous with the first upper surface 20a. This can clarify the luminance difference between the region surrounding the light-emitting region R and the light-emitting region R on the upper surface of the light-emitting device 100.

The light-transmissive member 20 may further include protruding portions 23 and 24 with a shape partially protruded in a lateral direction on the second lateral surface 20e and the third lateral surface 20f. As described later, the protruding portions 23 and 24 are formed when singulation into separate light-transmissive members 20 is performed in the manufacturing process. The protruding portions 23 and 24 are located along the perimeter of the lower surface 20c of the light-transmissive member 20 on the second lateral surface 20e and the third lateral surface 20f of the light-transmissive member 20. With the light-transmissive member 20 provided with the protruding portions 23 and 24, the adhesion between a light adjustment member 32, and the second lateral surface 20e and the third lateral surface 20f of the light-transmissive member 20 can be improved in the light-emitting device 100.

In the light-transmissive member 20, the thickness T1 from the lower surface 20c to the first upper surface 20a is larger than the thickness T2 from the lower surface 20c to the second upper surface 20b. Thus, in the case in which the light-transmissive member 20 contains a filler such as a light diffusion member, the multiple reflection of the light guided from the second light-emitting region R2 side to the first light-emitting region R1 side is suppressed, and the efficiency of light extraction from the light-emitting region R is improved.

Preferably, the thickness T1 from the lower surface 20c to the first upper surface 20a in the light-transmissive member 20 is 50 µm or larger in view of improvement of the mechanical strength, and 300 µm or smaller in view of reduction in the size of the light-emitting device 100. In more particular, the thickness T1 from the lower surface 20c to the first upper surface 20a is more preferably in a range from 55 µm to 200 µm, still more preferably in a range from 60 µm to 100 µm.

Similar to the thickness T1, the thickness T2 from the lower surface 20c to the second upper surface 20b is preferably in a range from 30 µm to 280 µm in view of the improvement of the mechanical strength and reduction in size, and in consideration of the difference from the thickness T1.

The difference between the thickness T1 from the lower surface 20c to the first upper surface 20a and the thickness T2 from the lower surface 20c to the second upper surface 20b can be adjusted as necessary in accordance with the desired light distribution. For example, in the case in which the luminance of the second light-emitting region R2 is set in a range from 5% to 80% of the luminance of the first light-emitting region R1, the thickness T2 of the light-transmissive member 20 at the second upper surface 20b may be in a range from 20% to 90% of the thickness T1 of the light-transmissive member 20 at the first upper surface 20a.

In addition, preferably, in the case in which the second upper surface 20b includes the curved surface portion 20b1, a thickness T3 from the lower surface 20c to the lower end of the first lateral surface 20d (i.e., the boundary between the second upper surface 20b and the first lateral surface 20d) is 90% or less of the thickness T1 in the light-transmissive member 20. In that case, the boundary between the first light-emitting region R1 and the second light-emitting region R2 can be clarified.

Preferably, the second upper surface 20b includes a protrusion and recession structure on the surface. In that case, the adhesion between the second upper surface 20b and the light adjustment member 31 can be improved. Specifically, preferably, a surface roughness Ra of the second upper surface 20b is greater than the surface roughness Ra of the first upper surface 20a. This can increase the adhesion between the second upper surface 20b of the light-transmissive member 20 and the light adjustment member 31, and suppress rising of the light adjustment member 31 to the first upper surface 20a. The surface roughness Ra of the second upper surface 20b is in a range from 0.3 μm to 10 μm, for example. When the surface roughness Ra of the second upper surface 20b is 0.3 μm or greater, the adhesion between the light-transmissive member 20 and the light adjustment member 31 is more improved. On the other hand, when the surface roughness Ra of the second upper surface 20b is 10 μm or less, it is easy to guide light to the first upper surface 20a side by reflecting the light at the interface between the light-transmissive member 20 and the light adjustment member 31.

The light-transmissive member 20 is, as an example, a wavelength conversion member containing a phosphor that performs wavelength conversion of first light emitted from the first light-emitting portion 11 and second light emitted from the second light-emitting portion 12 into third light. The light emission peak wavelengths of the first light and the second light are in a range from 420 nm to 460 nm, for example. The light emission peak wavelength of the third light is in a range from 500 nm to 600 nm, for example. Preferably, the phosphor concentration of the light-transmissive member 20 is in a range from 60 mass % to 70 mass %, for example. The phosphor concentration represents the ratio of the phosphor in the light-transmissive member 20 containing the phosphor.

Because the second upper surface 20b and the first lateral surface 20d of the light-transmissive member 20 are covered with the light adjustment member 31, light reflected by the light adjustment member 31 propagates through the light-transmissive member 20 and excites the phosphor again. Therefore, in the present embodiment, in consideration of the repetitive excitation of the phosphor by the light reflected by the light adjustment member 31, the thickness T2 from the lower surface 20c to the second upper surface 20b is set smaller than the thickness T1 from the lower surface 20c to the first upper surface 20a. Specifically, the amount of the phosphor disposed between the lower surface 20c and the second upper surface 20b is set smaller than the amount of the phosphor disposed between the lower surface 20c and the first upper surface 20a. In this manner, the chromaticity difference between the light emitted from the first light-emitting region R1 side and the light emitted from the second light-emitting region R2 side can be reduced, and the chromaticity unevenness between the first light-emitting region R1 and the second light-emitting region R2 in the light-emitting region R of the light-emitting device 100 can be reduced.

As the light-transmissive member 20, a light-transmissive resin, glass, ceramic, or the like may be used, for example. As the light-transmissive resin, a resin containing one or more of a silicone resin, a modified silicone resin, an epoxy resin, a modified epoxy resin, an acrylic resin, a phenol resin, and a polyimide resin may be used, for example. In addition, the light-transmissive member 20 may contain a phosphor that can convert the wavelength of at least a part of incident light. Examples of the light-transmissive member containing a phosphor include a sintered compact of a phosphor and a material containing phosphor powder in a light-transmissive resin, glass, ceramic, or the like, for example. In addition, the light-transmissive member 20 may be a member in which a phosphor-containing layer such as a resin layer containing a phosphor is disposed on the surface of a light-transmissive layer that is a formed body of a light-transmissive resin, glass, a ceramic, or the like.

As the phosphor, one that can be excited by the first light and the second light emitted from the first light-emitting portion 11 and the second light-emitting portion 12, respectively, can be used.

Examples of a phosphor that emits green light include an yttrium-aluminum-garnet-based phosphor (for example, $Y_3(Al, Ga)_5O_{12}$:Ce), a lutetium-aluminum-garnet-based phosphor (for example, $Lu_3(Al, Ga)_5O_{12}$:Ce), a terbium-aluminum-garnet-based phosphor (for example, $Tb_3(Al, Ga)_5O_{12}$:Ce), a silicate-based phosphor (for example, $(Ba, Sr)_2SiO_4$:Eu), a chlorosilicate-based phosphor (for example, $Ca_8Mg(SiO_4)_4Cl_2$:Eu), a β-sialon-based phosphor (for example, $Si_{6-z}Al_zO_zN_{8-z}$:Eu (0<z<4.2)), and an SGS-based phosphor (for example, $SrGa_2S_4$:Eu).

Examples of a phosphor that emits yellow light include an α-sialon-based phosphor (for example, $Mz(Si, Al)_{12}(O, N)_{16}$ (where 0<z≤2, and M is Li, Mg, Ca, Y, or a lanthanide element excluding La and Ce). In addition, the above phosphors that emit green light include a phosphor that emits yellow light. For example, when Y is partially substituted with Gd in the yttrium-aluminum-garnet-based phosphor, a light emission peak wavelength can be shifted to a long wavelength side, and thus, the yttrium-aluminum-garnet-based phosphor can emit yellow light. Further, the above phosphors include a phosphor that can emit orange light.

Examples of a phosphor that emits red light include a nitrogen-containing calcium aluminosilicate (CASN or SCASN)-based phosphor (for example, $(Sr, Ca)AlSiN_3$:Eu) and a BSESN-based phosphor (for example, $(Ba, Sr, Ca)_2Si_5N_8$:Eu). Other examples include a manganese-activated fluoride-based phosphor (a phosphor represented by a general formula (I) $A_2[M_{1-a}Mn_aF_6]$ (where, in the general formula (I), A is at least one element selected from the group consisting of K, Li, Na, Rb, Cs, and $NH_4$, M is at least one element selected from the group consisting of Group 4 elements and Group 14 elements, and a satisfies 0<a<0.2)). Examples of the manganese-activated fluoride-based phosphor include a KSF-based phosphor (for example, $K_2SiF_6$:Mn), a KSAF-based phosphor (for example, $K_2Si_{0.99}Al_{0.01}F_{5.99}$:Mn), and an MGF-based phosphor (for example, $3.5MgO·0.5MgF_2·GeO_2$:Mn).

For example, an yttrium-aluminum-garnet-based phosphor (for example, $(Y, Gd)_3Al_5O_{12}$:Ce) in which Y is partially substituted with Gd can be preferably used as a yellow light-emitting phosphor that can emit white mixed-color light in combination with a blue light-emitting element. In the case in which the light-emitting device 100 that can emit white light is provided, the type and concentration of the phosphor contained in the light-transmissive member 20 are adjusted such that white light of the desired chromaticity rank can be emitted.

Light Adjustment Member

The light adjustment member 30 covers the second upper surface 20b of the light-transmissive member 20. The light adjustment member 30 is an optical member having both light-blocking and light-transmitting optical properties. As a light-blocking property, a light reflecting property is preferably provided although a light absorbing property may be provided. The light adjustment member 30 may have both light-reflecting and light-transmitting optical properties with respect to light of all wavelengths emitted from the second upper surface 20b, or may have an optical property of blocking (preferably, reflecting) light with a specific wavelength while transmitting light of other wavelengths.

The light-emitting device 100 includes the light adjustment member 31 that covers the second upper surface 20b and the first lateral surface 20d of the light-transmissive member 20, and thus a part of light emitted from the second upper surface 20b can be reflected and the reflected light can exit the first light-emitting region R1 side. In this manner, the luminance of the first light-emitting region R1 can be made relatively higher than the luminance of the second light-emitting region R2.

The light-emitting device 100 may include, as the light adjustment member 30, the light adjustment member 31 that covers the second upper surface 20b and the first lateral surface 20d of the light-transmissive member 20, and the light adjustment member 32 that covers the second lateral surface 20e and the third lateral surface 20f of the light-transmissive member 20 and the lateral surface of the light-emitting element 10. In the case in which the light-emitting element 10 is disposed on the wiring substrate 40, the light adjustment member 32 may cover the upper surface of the wiring substrate 40. In this case, the light adjustment member 31 and the light adjustment member 32 are monolithically formed using the same material. The boundary between the light adjustment member 31 and the light adjustment member 32 is a plane perpendicular to the second upper surface 20b and along the boundary between the second upper surface 20b and the second lateral surface 20e (a broken line B2 illustrated in FIG. 1D), for example.

The light adjustment member 31 and the light adjustment member 32 may respectively be a first light adjustment member 31 and a second light adjustment member 32 that are individual members. The first individual light adjustment member 31 and the second individual light adjustment member 32 may be formed of the same material, or formed of materials different from each other.

It is preferable to use an insulating material for the light adjustment member 30. As the light adjustment member 30, a thermosetting resin, a thermoplastic resin, or the like may be used, for example. Specific examples of the light adjustment member 30 include a resin containing particles of a light reflective material. Examples of a resin include a resin containing at least one of a silicone resin, a modified silicone resin, an epoxy resin, a modified epoxy resin, an acrylic resin, a phenol resin, a bismaleimide triazine resin, and a polyphthalamide resin, and a hybrid resin thereof. Among these materials, it is preferable to use a resin containing, as a base polymer, a silicone resin, which exhibits a good heat resistance property and electrically insulating property and has flexibility. Examples of the light reflective material include titanium oxide, silicon oxide, zirconium oxide, magnesium oxide, calcium carbonate, calcium hydroxide, calcium silicate, zinc oxide, barium titanate, potassium titanate, aluminum oxide, aluminum nitride, boron nitride, and mullite, and a combination thereof. Among these materials, titanium oxide is preferable because it is relatively stable with respect to moisture or the like and has a high refractive index.

It is preferable to set the concentration of the light reflective material of the light adjustment member 30 in a range from 60 mass % to 70 mass %. The concentration of the light reflective material represents the ratio of the light reflective material in the light adjustment member 30 containing the light reflective material.

Preferably, the reflectance of the light adjustment member 30 is in a range from 1% to 95%, for example. The reflectance means the reflectance at the light emission peak wavelength of light emitted from the light-emitting element 10. Note that in the case in which the light emission peak wavelengths of the first light and the second light respectively emitted from the first light-emitting portion 11 and the second light-emitting portion 12 are different from each other, the reflectance means the reflectance at the light emission peak wavelength of the light with a shorter wavelength.

Preferably, the total luminous transmittance of the light adjustment member 30 is in a range from 1% to 35%, for example. The total luminous transmittance is the ratio of the amount of light transmitted through a targeted object to the amount of light incident on the targeted object. For example, the total luminous transmittance means a total luminous transmittance measured in compliance with Japan industrial standard JIS K 7375:2008.

As described above, the light adjustment member 30 is a resin member containing a light reflective material, for example. Thus, by using, as the light adjustment member 30, a resin member containing a light reflective material, the light adjustment member 30 can be easily handled and disposed on the second upper surface 20b.

The light adjustment member 31 may contain a phosphor. The phosphor contained in the light adjustment member 31 may be the same phosphor as that contained in the light-transmissive member 20, or may be a different phosphor. For example, the phosphor contained in the light adjustment member 31 may be a phosphor that differs from the phosphor contained in the light-transmissive member 20 in light emission peak wavelength. In that case, the chromaticity of the light emitted from the second light-emitting region R2 can be corrected. The phosphor contained in the light adjustment member 31 performs wavelength conversion of the first light and the second light into fourth light that differs from the first light and the second light in light emission peak wavelength, for example. The light emission peak wavelength of the fourth light is in a range from 470 nm to 660 nm, for example. Preferably, the phosphor concentration of the light adjustment member 31 is lower than the concentration of the light reflective material in the light adjustment member, and is preferably in a range from 5 mass % to 30 mass %. The phosphor concentration represents the ratio of the phosphor in the light adjustment member 31 containing the phosphor.

Preferably, in the light-emitting region R, the first light-emitting region R1 (i.e., the first upper surface 20a of the light-transmissive member 20) and the second light-emitting region R2 (i.e., the upper surface of the light adjustment member 31) are flush with each other (i.e., located in the same plane). This makes it easy to adjust the focal point position and the like of an optical system such as a reflector and a lens in the case in which the light-emitting device 100 is used for a headlight of a vehicle, for example. Note that the thickness of the light adjustment member 31 may be adjusted as necessary with reference to the thicknesses T1, T2, and T3 of the light-transmissive member 20 and the like. In addition, while the light adjustment member 31 is disposed together with the light adjustment member 32 in the above-described example, the light adjustment member 31 may be disposed independently without providing the light adjustment member 32.

Wiring Substrate

In the light-emitting device 100, the light-emitting element 10 can be disposed on the wiring substrate 40.

The wiring substrate 40 includes a base body 41, and a wiring 42 disposed at least on the upper surface of the base body 41. The wiring 42 is a member through which power is supplied to the first element electrode 16 and the second element electrode 17 of the light-emitting element 10 through a conductive member 50. The first element electrode 16 and the second element electrode 17 are disposed on the wiring 42 with the conductive member 50 interposed therebetween. For the conductive member 50, conductive metals such as metal materials formed of Cu, Au, or their alloys may be used. Note that regarding the light-emitting element 10 and the wiring 42, the element electrodes and the wiring 42 may be directly joined without the conductive member 50 interposed therebetween.

The wiring substrate 40 includes the wiring 42 that connects the first light-emitting portion 11 and the second light-emitting portion 12 in series.

The wiring 42 includes a first wiring 421, a second wiring 422, and a third wiring 423, for example. The first element electrode 16 (specifically, the P-side electrode 162) is disposed at the first wiring 421, the second element electrode 17 (specifically, the N-side electrode 171 and the N-side electrode 173) is disposed at the second wiring 422, and the first element electrode 16 (i.e., the N-side electrode 161 and the N-side electrode 163) and the second element electrode 17 (i.e., the P-side electrode 172) are disposed at the third wiring 423. In addition, an electronic component 441 is disposed at the first wiring 421 and the second wiring 422. With the above-described wiring 42, a current can be supplied to the first light-emitting portion 11 and the second light-emitting portion 12 with one circuit, and thus the wiring substrate 40 can be downsized. In this manner, the light-emitting device 100 can be downsized. In the wiring 42, the third wiring 423 is disposed between the first wiring 421 and the second wiring 422. Note that the wiring 42 may include a wiring for individually driving the first light-emitting portion 11 and the second light-emitting portion 12, for example. In this case, the wiring substrate 40 can individually control the amounts of current supplied to the first light-emitting portion 11 and the second light-emitting portion 12.

For the base body 41, materials publicly known in the field may be used as the base body included in the wiring substrate for supporting the electronic components such as the light-emitting elements. For example, an insulating material such as glass epoxy, a resin, or a ceramic, a semiconductor material such as silicon, or a conductive material such as copper may be used. In particular, a ceramic, which has high heat resistance and light resistance, can be preferably used. Examples of ceramic include aluminum oxide, aluminum nitride, silicon nitride, LTCC, and the like. In addition, a composite material of such an insulating material, a semiconductor material, and a conductive material may also be used. In the case in which a semiconductor material or a conductive material is used for the base body 41, the wiring 42 can be disposed on the upper surface of the base body 41 with the insulation layer interposed therebetween. Examples of the material of the wiring 42 include metals such as Fe, Cu, Ni, Al, Ag, Au, Pt, Ti, W, and Pd, and alloys containing at least one of them.

Operation of Light-Emitting Device

Upon activation of the light-emitting device 100, a current is fed from an external power source to the light-emitting element 10, and the light-emitting element 10 emits light. At least a part of the first light and the second light emitted from the light-emitting element 10 is subjected to wavelength conversion into the third light by the phosphor contained in the light-transmissive member 20. The third light is mixed with the first light and the second light that are not subjected to wavelength conversion into the third light. The mixed light exits to the outside as white light, for example. In this case, as described above, because the light adjustment member 31 is disposed on the second upper surface 20b of the light-transmissive member 20, a part of the light emitted from the second upper surface 20b is reflected by the light adjustment member 31, propagated in the light-transmissive member 20, and emitted from the first light-emitting region R1 side. In this manner, the luminance of the second light-emitting region R2 decreases and the luminance of the first light-emitting region R1 relatively increases. In this manner, the light-emitting device 100 can include a high luminance region in the emission region where the light is emitted from the light-emitting region R. In the light-transmissive member 20, the thickness T2 from the lower surface 20c to the second upper surface 20b is smaller than the thickness T1 from the lower surface 20c to the first upper surface 20a. This reduces repetitive excitation of the phosphor in the light-transmissive member 20 due to the light reflected by the light adjustment member 31. In this manner, the chromaticity of the light emitted from the first light-emitting region R1 side and the chromaticity of the light emitted from the second light-emitting region R2 side can be adjusted.

Now, the luminance difference provided by the light adjustment member 31 is specifically described below with reference to FIG. 2. In addition, the description will be made with reference to FIG. 1D as necessary. Note that FIG. 2 schematically illustrates only a part of the light path for the sake of simplification of the description. While the travelling direction of the actual light changes as necessary between members and inside each member through refraction, scattering, and the like, the illustration may be omitted for the sake of simplification.

Most of the first light L1 emitted from the first light-emitting portion 11 is emitted from the first upper surface 20a of the light-transmissive member 20. On the other hand, while most of the second light L2 emitted from the second light-emitting portion 12 travels toward the second upper surface 20b of the light-transmissive member 20, a part of the light is reflected by the light adjustment member 31 toward the support substrate 15 side so as to be reflected by the support substrate 15 and emitted from the first upper surface 20a of the light-transmissive member 20, for example. Another part of the second light L2 is transmitted through the light adjustment member 31 and emitted from the upper surface of the light adjustment member 31. In this manner, the amount of the light emitted from the first light-emitting region R1 increases, and the amount of the light emitted from the second light-emitting region R2 decreases. Thus, the luminance of the first light-emitting region R1 increases, and the luminance of the second light-emitting region R2 relatively decreases.

In addition, in the light-transmissive member 20 containing the phosphor, the thickness T2 from the lower surface 20c to the second upper surface 20b is smaller than the thickness T1 from the lower surface 20c to the first upper surface 20a. Thus, in the region overlapping the second light-emitting region R2 in plan view, the amount of the phosphor contained in the light-transmissive member 20 is smaller than in the region overlapping the first light-emitting region R1 in plan view. Specifically, the ratio of the light subjected to wavelength conversion in the light emitted from the second upper surface 20b is smaller than that in the light emitted from the first upper surface 20a, and as a result a chromaticity difference is caused between the light emitted from the second upper surface 20b and the light emitted from the first upper surface 20a. However, because the ratio of the light subjected to wavelength conversion in the light emitted from the second light-emitting region R2 is large, the chromaticity difference between the light emitted from the first light-emitting portion 11 and the light emitted from the second light-emitting portion 12 can be reduced. In this manner, for example, the chromaticities of white light emitted from the light-emitting device 100 with a luminance difference can be adjusted to approximately equal chromaticities. In this manner, by adjusting the height difference between the first upper surface 20a and the second upper surface 20b and adjusting the phosphor concentration of the light-transmissive member 20, the light-emitting device 100 can include in the light-emitting region R the first light-emitting region R1, which is a region with a relatively high luminance, and the second light-emitting region R2, which is a region with a relatively low luminance, and can adjust their emission chromaticities to the desired chromaticities.

Method for Manufacturing Light-Emitting Device

Figure 3:
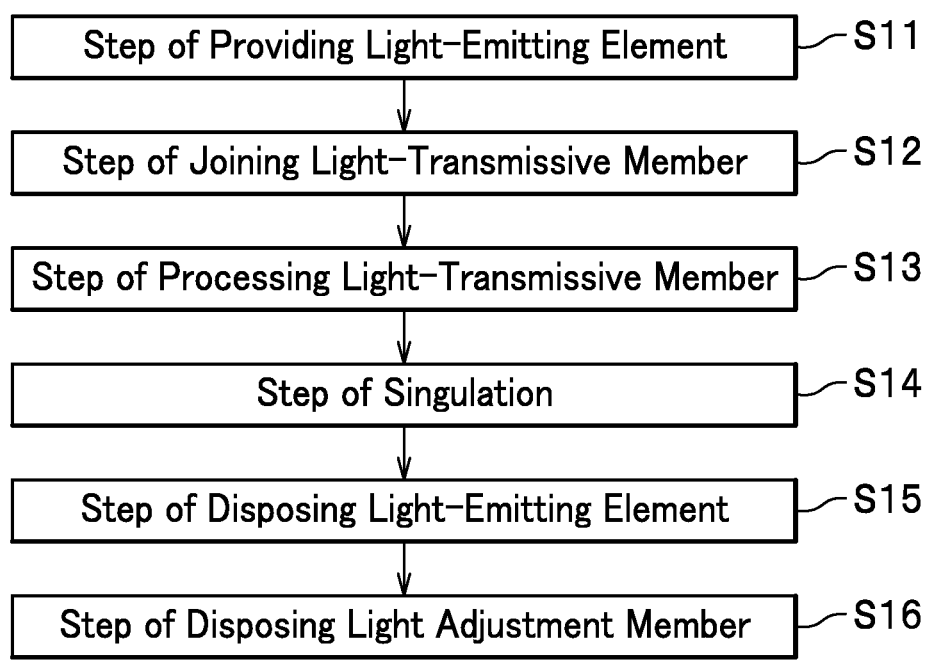
FIG. 3 is a flowchart of a method for manufacturing the light-emitting device according to the first embodiment.
Figure 4A:
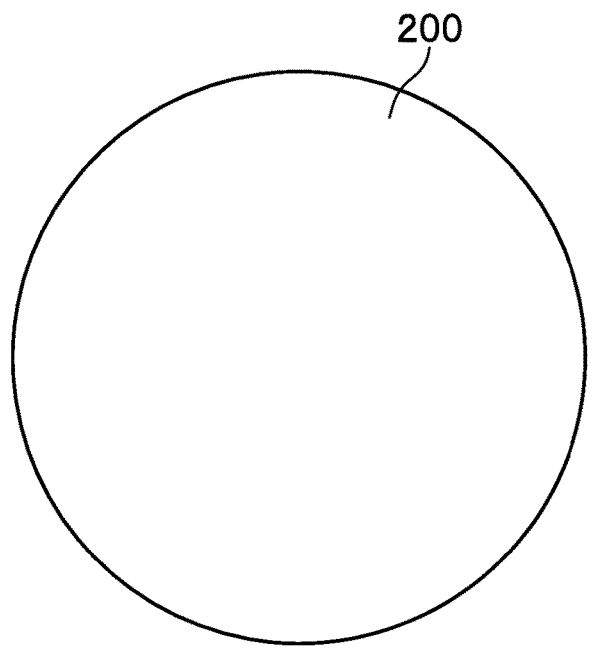
FIG. 4A is a schematic plan view illustrating the method for manufacturing the light-emitting device according to the first embodiment.

FIG. 3 is a flowchart of a method for manufacturing the light-emitting device according to the first embodiment. FIGS. 4A, 4C, and 4E are schematic plan views illustrating the method for manufacturing the light-emitting device according to the first embodiment. FIGS. 4B, 4D, and 4F to 4J are schematic sectional views illustrating the method for manufacturing the light-emitting device according to the first embodiment.

The method for manufacturing the light-emitting device 100 includes: providing the light-emitting element 10, the light-emitting element 10 including, the support substrate 15 having the first surface 15a and the second surface 15b located on the side opposite to the first surface 15a, and the light-emitting portions 11 and 12 disposed on the second surface 15b of the support substrate 15, the light-emitting portion 11 including a semiconductor layered body including the first semiconductor layer 111, the light-emitting layer 112, and the second semiconductor layer 113 in this sequence, and the light-emitting portion 12 including a semiconductor layered body including the first semiconductor layer 121, the light-emitting layer 122, and the second semiconductor layer 123 in this sequence; joining a light-transmissive member 200 to the support substrate 15, the joining including, providing the light-transmissive member 200 having the first surface and the second surface located on the side opposite to the first surface, and joining the first surface 15a of the support substrate 15 and the second surface of the light-transmissive member 200; processing the first surface of the light-transmissive member 200 so as to provide the first upper surface 20a, and the second upper surface 20b with a thickness from the second surface smaller than a thickness from the second surface to the first upper surface 20a; and disposing, on the first surface side of light-transmissive member 200, the light adjustment member 31 that exposes the first upper surface 20a and covers the second upper surface 20b.

In addition, the method for manufacturing the light-emitting device 100 may include disposing, over the wiring substrate 40, the light-emitting element 10 to which the light-transmissive member 20 is joined, after processing the first surface of the light-transmissive member 200 and before disposing the light adjustment member 31.

The method for manufacturing the light-emitting device 100 will be described assuming that it includes a step S11 of providing the light-emitting element, a step S12 of joining the light-transmissive member, a step S13 of processing the light-transmissive member, a step S14 of singulation, a step S15 of disposing the light-emitting element, and a step S16 of disposing the light adjustment member.

Note that the materials, arrangement, and the like of the members are as in the description of the light-emitting device 100, and thus descriptions thereof will be omitted as appropriate. In addition, the number of the light-emitting elements and the sizes of the light-transmissive members are illustrated in an easy-to-illustrate manner, and are therefore not limited to the illustration. In addition, the description will be made with reference to FIG. 1D as necessary.

Step of Providing Light-Emitting Element

In the step S11 of providing the light-emitting element, the light-emitting element 10 including the support substrate 15, the first light-emitting portion 11, the second light-emitting portion 12, the first element electrode 16, and the second element electrode 17 is provided.

In the step S11 of providing the light-emitting element, a semiconductor wafer 101 in which a plurality of regions that become separate light-emitting portions after the singulation are disposed on the support substrate 15 is provided.

In the step S11 of providing the light-emitting element, the light-emitting element 10 may be provided as a semiconductor wafer that becomes separate light-emitting elements 10 after the singulation, or may be provided as an individual light-emitting element 10 obtained by the singulation. Note that the following step is described assuming that the light-emitting element 10 is provided as the semiconductor wafer 101. Preferably, in the case in which the semiconductor wafer 101 is provided in the step S11 of providing the light-emitting element, the step S11 of providing the light-emitting element includes a step of forming a crack 151 with a laser at a location where division is to be performed in singulation.

In the case in which the separated light-emitting elements 10 are provided in the step S11 of providing the light-emitting element, the step S11 of providing the light-emitting element may include a singulation step of dividing the semiconductor wafer 101 into separate light-emitting elements 10. The singulation may be performed by a publicly known method such as blade dicing or laser dicing.

Note that the light-emitting element 10 can be provided through some or all of manufacturing steps such as a semiconductor growth step. Alternatively, the light-emitting element 10 may be provided by purchasing it or other ways.

Step of Joining Light-Transmissive Member

Figure 4B:
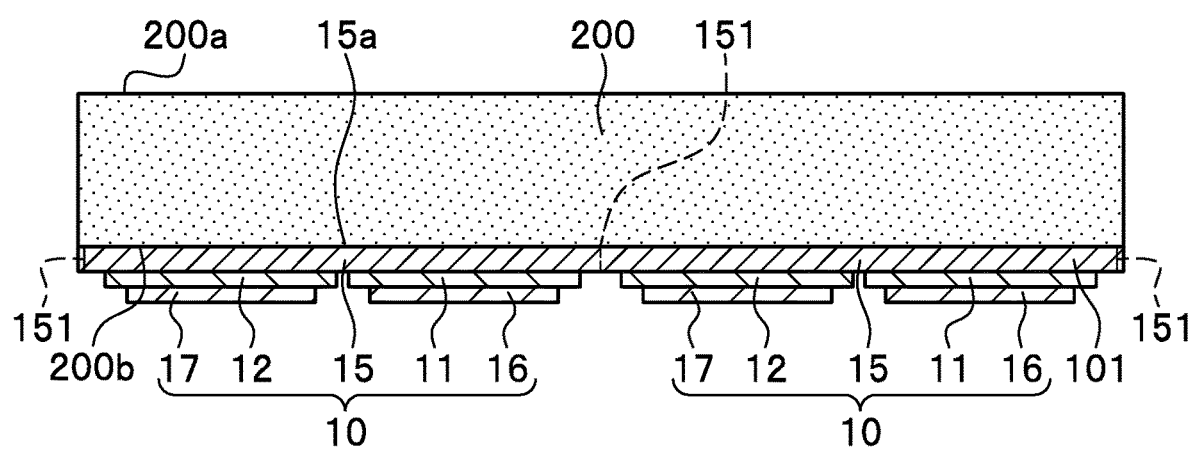
FIG. 4B is a schematic sectional view illustrating the method for manufacturing the light-emitting device according to the first embodiment.
Figure 4C:
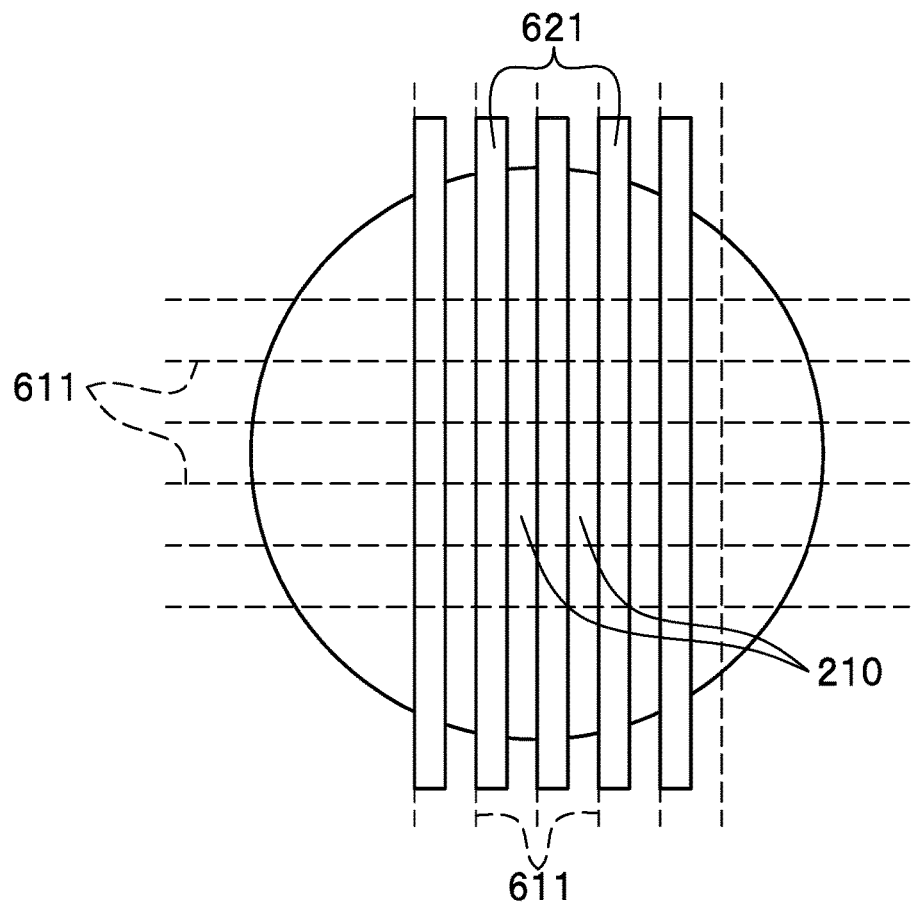
FIG. 4C is a schematic plan view illustrating the method for manufacturing the light-emitting device according to the first embodiment.
Figure 4D:
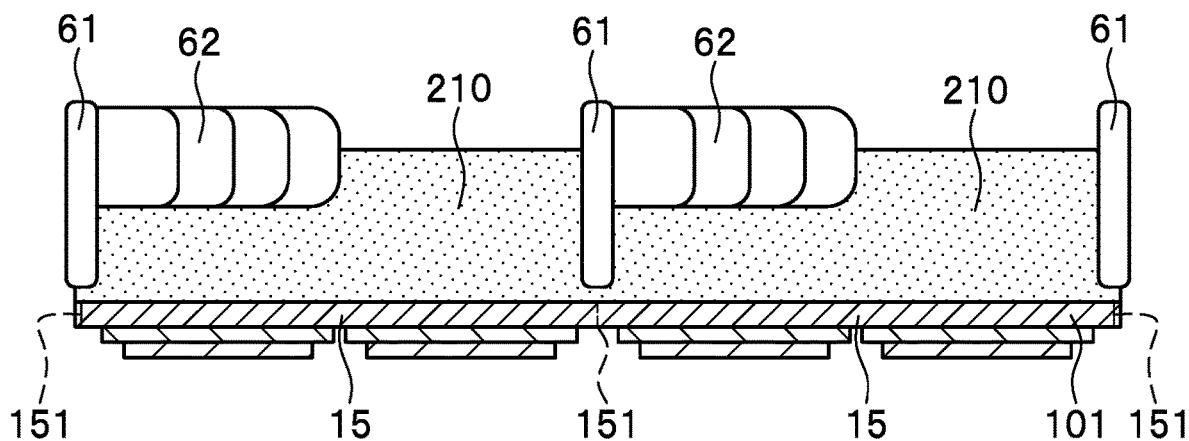
FIG. 4D is a schematic sectional view illustrating the method for manufacturing the light-emitting device according to the first embodiment.
Figure 4E:
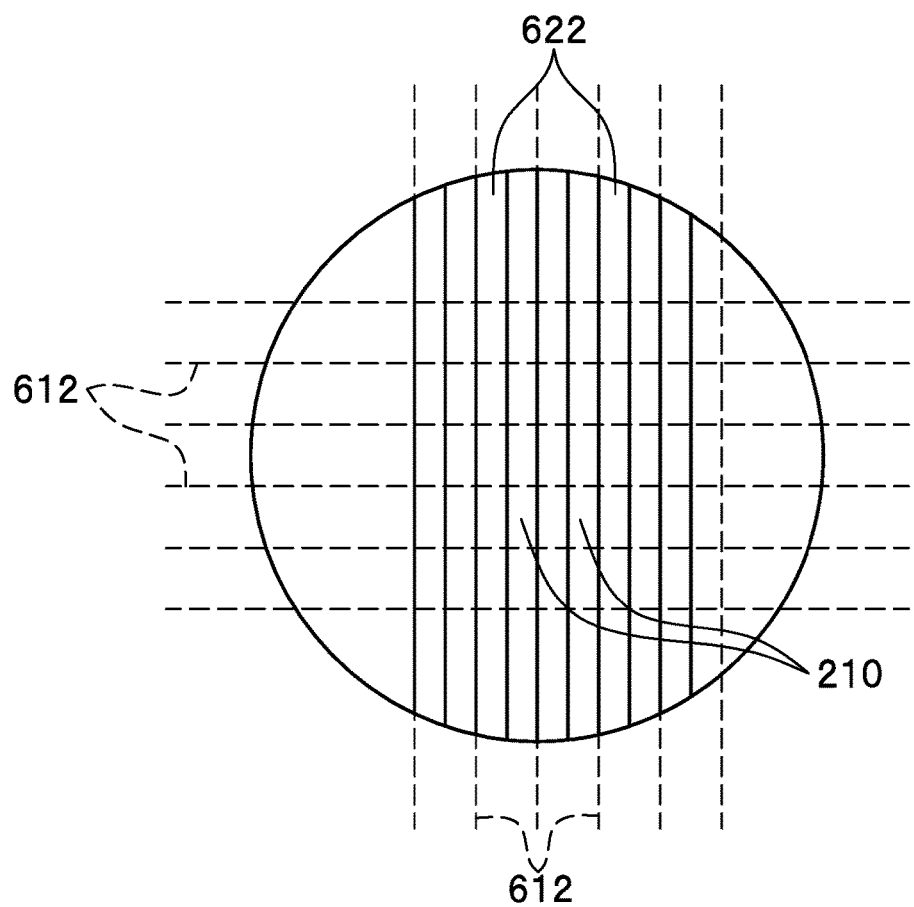
FIG. 4E is a schematic plan view illustrating the method for manufacturing the light-emitting device according to the first embodiment.

As illustrated in FIGS. 4A and 4B, in the step S12 of joining the light-transmissive member, the light-transmissive member 200 is joined to the first surface 15a of the support substrate 15.

In the step S12 of joining the light-transmissive member, the light-transmissive member 200 having a first surface 200a and a second surface 200b located on the side opposite to the first surface 200a is provided. The light-transmissive member 200 is a single plate-shaped light-transmissive member including a plurality of regions that become separate light-transmissive members 20 after the singulation. Subsequently, the first surface 15a of the support substrate 15 and the second surface 200b of the light-transmissive member 200 are joined to each other.

The light-transmissive member 200 can be joined to the support substrate 15 by a direct joining method such as pressure bonding, surface activated bonding, atomic diffusion bonding, or hydroxyl bonding, for example. Note that the light-transmissive member 200 may be joined to the support substrate 15, using a publicly known adhesive member.

Step of Processing Light-Transmissive Member

As illustrated in FIGS. 4C to 4F, in the step S13 of processing the light-transmissive member, the light-transmissive member 200 is processed such that after the singulation, the light-transmissive member 20 has the first upper surface 20a, the second upper surface 20b, the lower surface 20c located on the side opposite to the first upper surface 20a and the second upper surface 20b, the first lateral surface 20d contiguous with the first upper surface 20a and the second upper surface 20b, the second lateral surface 20e contiguous with the second upper surface 20b and the lower surface 20c, and the third lateral surface 20f contiguous with the first upper surface 20a and the lower surface 20c, and has the thickness T1 from the lower surface 20c to the first upper surface 20a larger than the thickness T2 from the lower surface 20c to the second upper surface 20b.

Figure 4F:
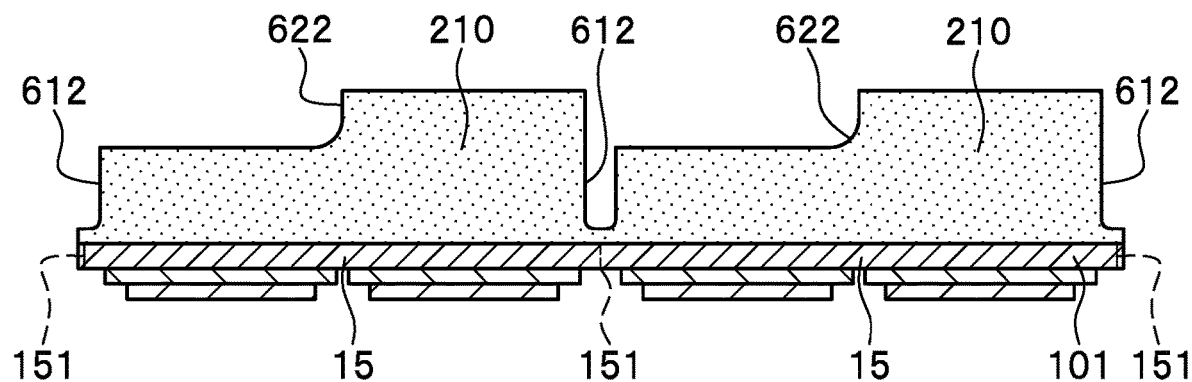
FIG. 4F is a schematic sectional view illustrating the method for manufacturing the light-emitting device according to the first embodiment.

In the step S13 of processing the light-transmissive member, a first groove portion 612 is formed on the first surface 200a side of the light-transmissive member 200 by removing a portion of the light-transmissive member 200 with a blade 61 along a predetermined removal line 611 as illustrated in FIGS. 4C to 4F. Preferably, the predetermined removal line 611 is located at a position overlapping the crack 151 for the singulation into separate light-emitting elements 10. The first groove portion 612 may reach the support substrate 15; however, preferably, it does not reach the support substrate 15 to avoid unintended chipping or cracking of the support substrate 15. In this case, the first groove portion 612 is formed by using the blade 61 with a blade thickness substantially equal to the desired width of the first groove portion 612 (i.e., the width of the predetermined removal line 611). In addition, in the region where the second upper surface 20b is located, a part of the light-transmissive member 200 on the first surface 200a side is removed along a predetermined removal line 621 with a blade 62 as illustrated in FIGS. 4C to 4F. In this manner, a second groove portion 622 is formed. In this case, the second groove portion 622 along the predetermined removal line 621 is formed by repeating the removal multiple times (here, four times) using the blade 62 with a blade thickness smaller than the desired width of the second groove portion 622 (i.e., the width of the predetermined removal line 621) while shifting the entry position of the blade 62. In this manner, as illustrated in FIG. 4F, a light-transmissive member 210 processed into a desired shape is formed on the support substrate 15. Note that in FIG. 4D, both the blade 61 with which the first groove portion 612 is formed and the blade 62 that moves multiple times while shifting the entry position to form the second groove portion 622 are illustrated with the solid lines. In addition, in FIG. 4E, the first groove portion 612 is extended from the outer edge of the circular light-transmissive member for convenience of the illustration. In addition, the width of the groove portion as used in the present specification means the maximum value of the length of the groove portion in the direction perpendicular to the direction in which the length of the groove portion is the maximum in plan view.

Singulation Step

Figure 4G:
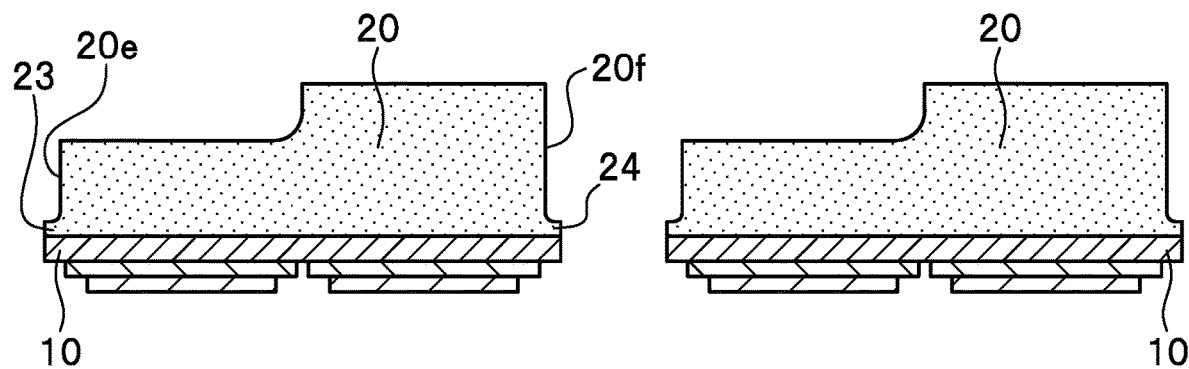
FIG. 4G is a schematic sectional view illustrating the method for manufacturing the light-emitting device according to the first embodiment.

In the step S14 of singulation, the light-transmissive member 210 and the support substrate 15 are divided as illustrated in FIG. 4G.

In the step S14 of singulation, the light-transmissive member 210 is split at the first groove portion 612. Because the first groove portion 612 is disposed at a position overlapping the crack 151, the support substrate 15 is also divided along the crack 151 at the time of split. Further, the divided light-transmissive member 20 includes the protruding portions 23 and 24 with partially laterally protruded shapes on the second lateral surface 20e and the third lateral surface 20f. The protruding portions 23 and 24 are regions located on the lower side of the first groove portion 612 formed in the processing step. In this manner, the light-emitting element 10 on which the separate light-transmissive member 20 is disposed is obtained. Because the light-transmissive member 20 includes the protruding portions 23 and 24 formed through splitting, and the support substrate 15 is divided along the crack 151 simultaneously with the split of the light-transmissive member 210, the lower surface 20c of the light-transmissive member 20 can easily be provided with the same area (dimensions) as that of the first surface 15a of the support substrate 15. Further, the outer edges of the lower surface 20c of the light-transmissive member 20 and the first surface 15a of the support substrate 15 overlap in plan view. Thus, the light is easily guided from the light-emitting element 10 to the light-transmissive member 20, and the light extraction efficiency of the light-emitting device 100 is improved.

Step of Disposing Light-Emitting Element

Figure 4H:
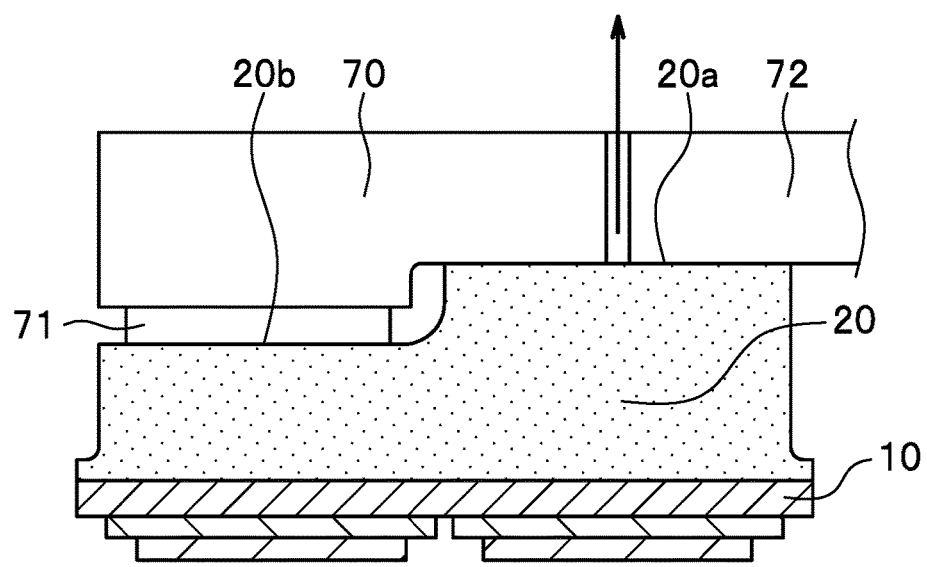
FIG. 4H is a schematic sectional view illustrating the method for manufacturing the light-emitting device according to the first embodiment.
Figure 4I:
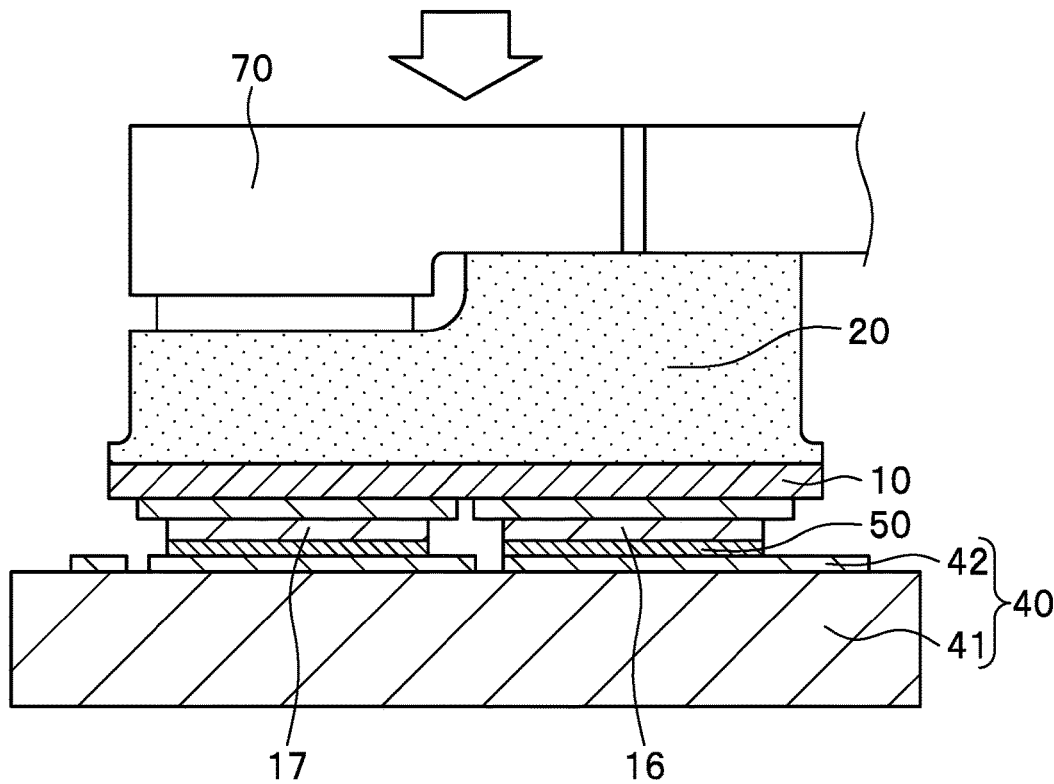
FIG. 4I is a schematic sectional view illustrating the method for manufacturing the light-emitting device according to the first embodiment.

In the step S15 of disposing the light-emitting element, the light-emitting element 10 to which the light-transmissive member 20 is joined is disposed over the wiring substrate 40 as illustrated in FIGS. 4H and 4I.

In the step S15 of disposing the light-emitting element, the first upper surface 20a of the light-transmissive member 20 is suctioned by a suctioning portion 72 of a collet 70, and the light-emitting element 10 to which the light-transmissive member 20 is joined is moved to a predetermined position of the wiring substrate 40, for example. Preferably, the collet 70 includes a flexible adjusting portion 71 at a portion that makes contact with the second upper surface 20b. In that case, the light-transmissive member 20 with the processed upper surface can be stably held.

Then, the first element electrode 16 and the second element electrode 17, and the wiring 42 are joined to each other by disposing the light-emitting element 10 in which the light-transmissive member 20 is joined to the wiring substrate 40 with the conductive member 50 interposed therebetween, and pressing the collet 70 in the direction toward the wiring substrate 40 side as illustrated by the arrow in FIG. 4I.

Step of Disposing Light Adjustment Member

Figure 4J:
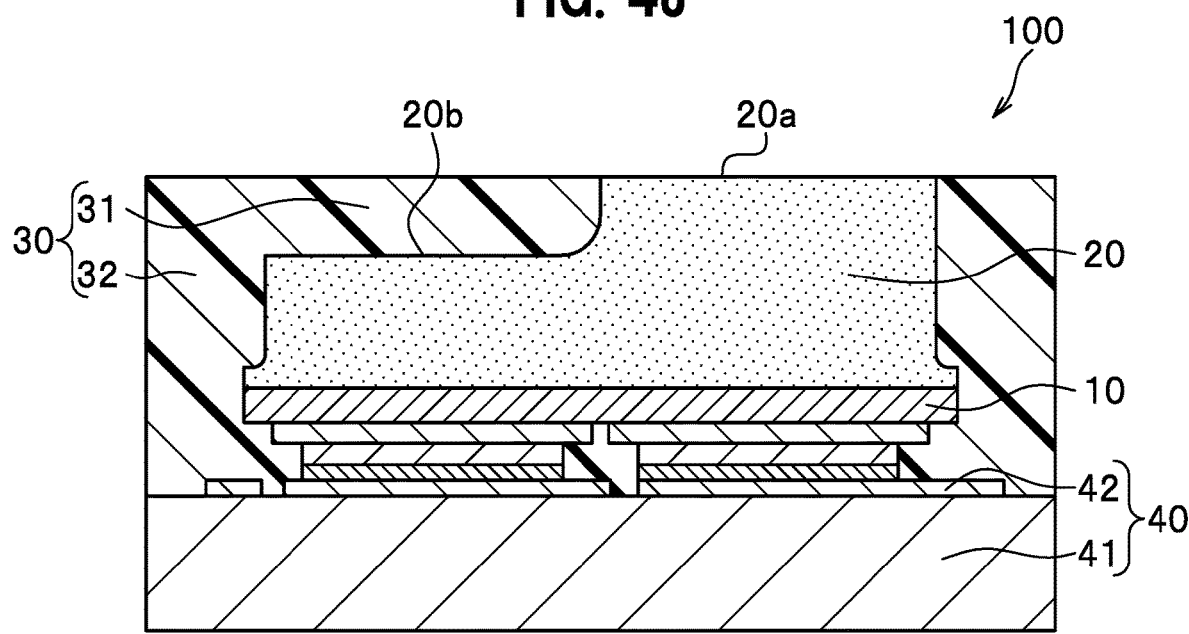
FIG. 4J is a schematic sectional view illustrating the method for manufacturing the light-emitting device according to the first embodiment.

In the step S16 of disposing the light adjustment member, the light adjustment member 31 that exposes the first upper surface 20a of the light-transmissive member 20 and covers the second upper surface 20b is disposed as illustrated in FIG. 4J. Here, further, the light adjustment member 32 is disposed covering the lateral surface of the light-transmissive member 20, the lateral surface of the light-emitting element 10, and the upper surface of the wiring substrate 40.

In the step S16 of disposing the light adjustment member, an uncured resin for forming the light adjustment member 30 is disposed on the wiring substrate 40 in such a manner as to expose the first upper surface 20a of the light-transmissive member 20 and cover the second upper surface 20b and the lateral surface. The resin may be disposed by potting, for example. In addition, the resin may be disposed by compression molding, transfer molding, or the like. Thereafter, the resin is cured to form the light adjustment member 30. Note that the light adjustment member 30 may be formed by disposing a frame for holding the resin in advance at a desired position in the wiring substrate 40, and supplying the resin in the frame. In addition, the upper surface of the formed light adjustment member 30 may be cut to adjust its height and the upper surface of the light adjustment member 30 may be processed to have a flat shape, as necessary.

Note that in the method for manufacturing the light-emitting device 100, a plurality of the light-emitting devices 100 may be manufactured simultaneously using a single wiring substrate including a plurality of continuous regions each of which becomes the wiring substrate 40 of the light-emitting device 100 after singulation, or the light-emitting device 100 may be manufactured individually. In the case in which a plurality of the light-emitting devices 100 are simultaneously manufactured, separate light-emitting devices 100 are formed by performing the singulation after the step S16 of disposing the light adjustment member.

Next, other embodiments will be described. Note that here, the description will be made with reference to FIG. 1D as necessary, and the description of the components described above will be omitted as necessary. Note that the light-emitting devices according to other embodiments described below can also include a high luminance region in the light-emitting surface.

Second to Fifth Embodiments

FIGS. 5A to 5D are schematic sectional views illustrating light-emitting devices according to second to fifth embodiments.

The configurations of a light-emitting device 100A to a light-emitting device 100D differ from that of the light-emitting device 100 of the first embodiment in that a light-transmissive plate 80 that covers the upper surface of the light adjustment member 31 is provided.

Figure 5A:
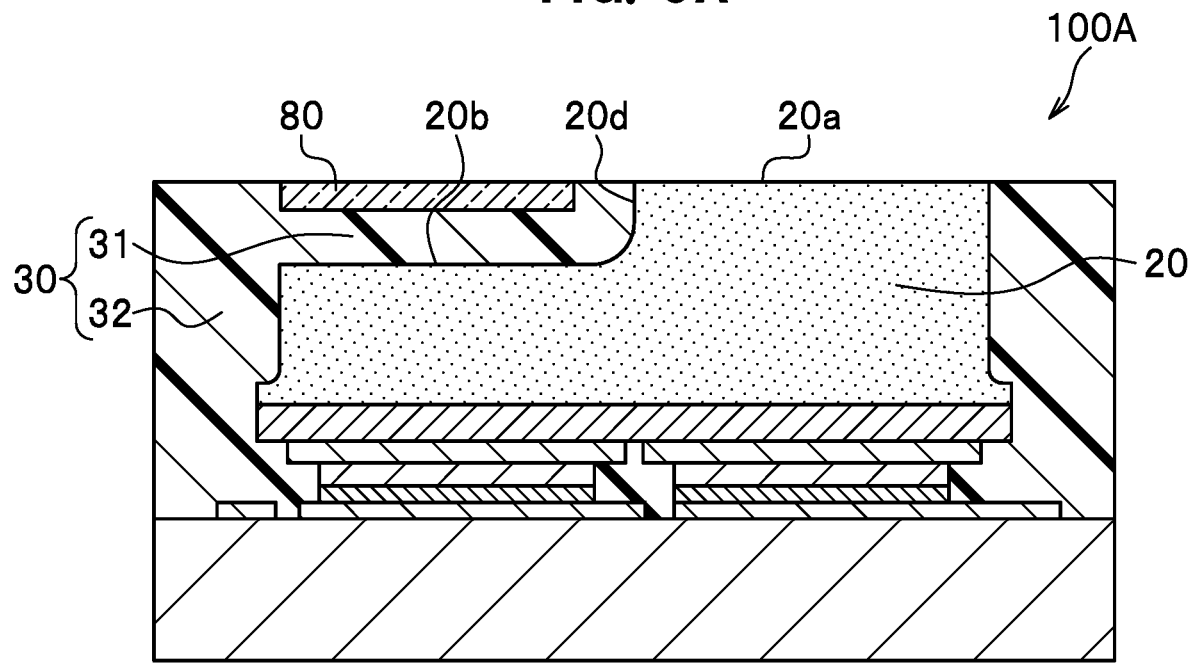
FIG. 5A is a schematic sectional view illustrating a light-emitting device according to a second embodiment.
Figure 5B:
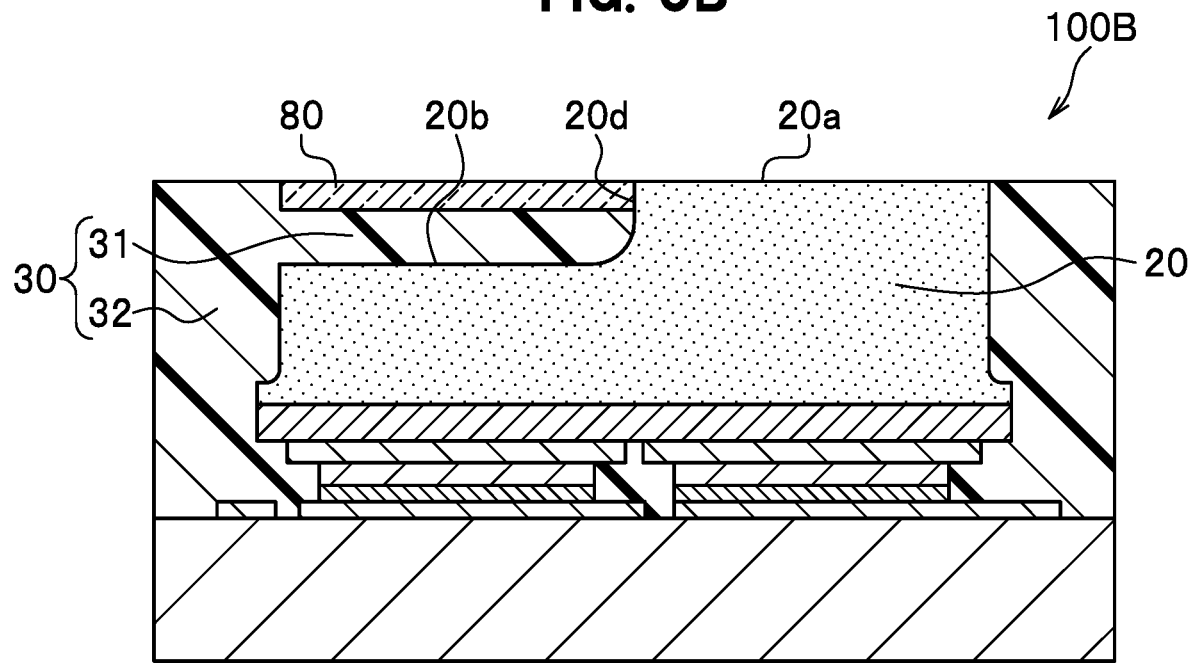
FIG. 5B is a schematic sectional view illustrating a light-emitting device according to a third embodiment.
Figure 5C:
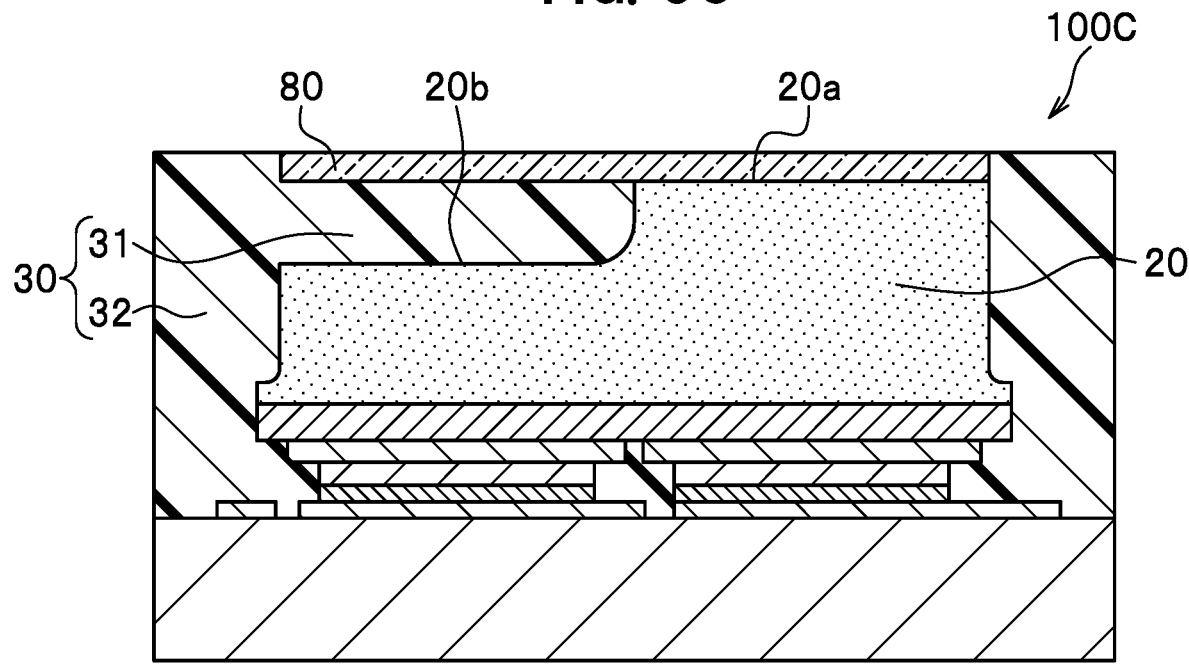
FIG. 5C is a schematic sectional view illustrating a light-emitting device according to a fourth embodiment.
Figure 5D:
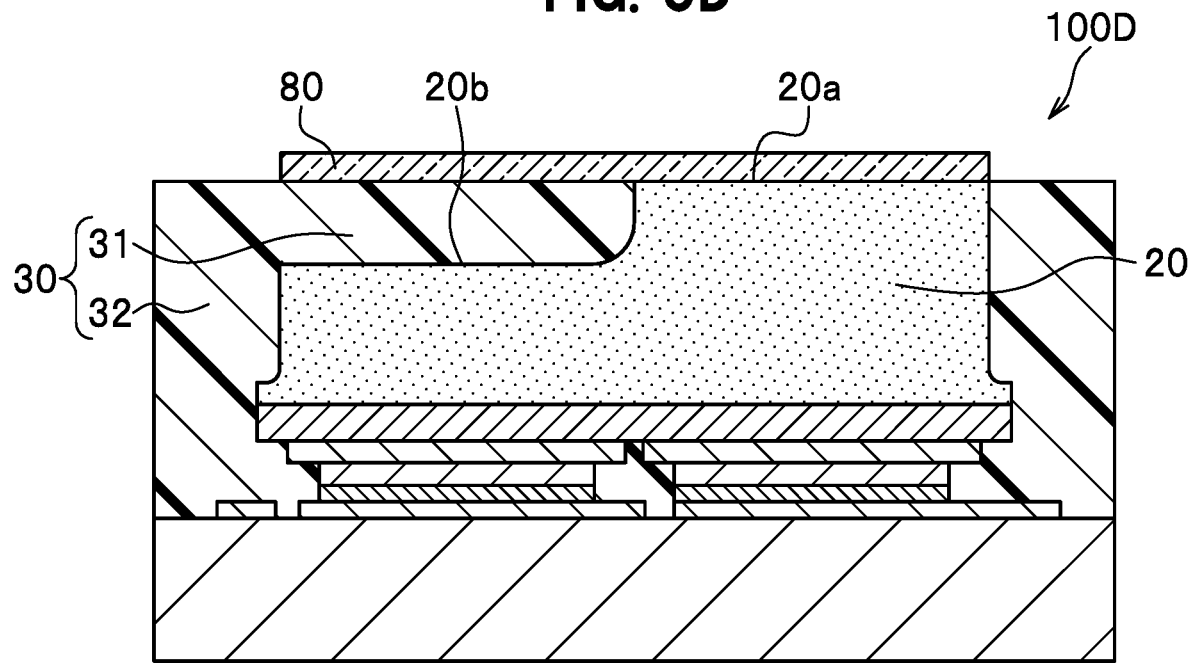
FIG. 5D is a schematic sectional view illustrating a light-emitting device according to a fifth embodiment.

As illustrated in FIG. 5A, in the light-emitting device 100A, the light-transmissive plate 80 is disposed at a position facing the second upper surface 20b of the light-transmissive member 20. The light-transmissive plate 80 is disposed on the light adjustment member 31 at a position spaced from the first lateral surface 20d. In addition, the light-transmissive plate 80 is disposed such that the upper surface of the light-transmissive plate 80 and the first upper surface 20a of the light-transmissive member 20 are flush with each other.

Because the light-emitting device 100A is provided with the light-transmissive plate 80, the light adjustment member 31 can be protected. In particular, in the case in which the light adjustment member 31 contains a resin, the degradation of the resin can be suppressed and the light-emitting surface can be protected. Thus, the light-emitting device 100A can provide a luminance difference in the light-emitting region and can have improved reliability.

The configuration of the light-emitting device 100B differs from that of the light-emitting device 100A in that the light-transmissive plate 80 extends to be in contact with the first lateral surface 20d at a position facing the second upper surface 20b of the light-transmissive member 20. The light-emitting device 100B also achieves an effect similar to that of the light-emitting device 100A.

The configuration of the light-emitting device 100C differs from that of the light-emitting device 100B in that the light-transmissive plate 80 is disposed at a position facing the first upper surface 20a and the second upper surface 20b of the light-transmissive member 20. In the light-emitting device 100C, the light adjustment member 31 and the light-transmissive member 20 can be protected, the degradation of the light adjustment member 31 and the light-transmissive member 20 can be suppressed, and the light-emitting surface can be more widely protected.

The configuration of the light-emitting device 100D differs from that of the light-emitting device 100C in that the lateral surface of the light-transmissive plate 80 is exposed from the light adjustment member 31. The light-emitting device 100D can be easily manufactured because the light-transmissive plate 80 can be disposed after the light adjustment member 30 is disposed.

Examples of the light-transmissive plate 80 used in the light-emitting devices 100A to 100D include light-transmissive materials, such as a resin, glass, and an inorganic substance, molded into a plate shape. Examples of the glass include borosilicate glass and quartz glass, and examples of the resin include a silicone resin and an epoxy resin. In particular, it is preferable to use glass for the light-transmissive plate 80, taking into consideration its resistance to degradation by light and mechanical strength, for example. Note that the light-transmissive plate 80 may contain a light diffusion member. When the light-transmissive plate 80 contains a light diffusion member, uneven chromaticity and uneven luminance can be inhibited. Examples of the light diffusion member include titanium oxide, barium titanate, aluminum oxide, and silicon oxide.

In addition, the light-emitting devices 100A to 100D include the light-transmissive plate 80 at least in the second light-emitting region R2. Accordingly, in a non-light emission period of the light-emitting device, it is easy to recognize the position of the light-emitting region R including the second light-emitting region R2. Thus, it is easy to perform alignment with an optical system.

Preferably, the thickness of the light-transmissive plate 80 used in the light-emitting devices 100A to 100D is in a range from 30 μm to 230 μm, for example. When the thickness of the light-transmissive plate 80 is 30 μm or larger, the light adjustment member 31 can be more easily protected. On the other hand, when the thickness of the light-transmissive plate 80 is 230 μm or smaller, the thickness of the light adjustment member 31 can be ensured, and the size of the light-emitting device can be more easily reduced. Note that the thickness of the light-transmissive plate 80 is the thickness in the direction perpendicular to the upper surface of the wiring substrate 40 or the first surface 15a of the support substrate 15.

The light-emitting device 100A and the light-emitting device 100B may be manufactured in such a manner that when the light adjustment member 30 is disposed, an uncured resin is disposed, and then the light-transmissive plate 80 is disposed at a predetermined position, and thereafter, the resin is cured, for example. Alternatively, a predetermined portion in the upper surface of the light adjustment member 31 may be cut after the resin is cured, and the light-transmissive plate 80 may be disposed with a publicly known adhesive member or the like interposed therebetween.

The light-emitting devices 100C and 100D may be manufactured in such a manner that after the light adjustment member 30 is disposed, the light-transmissive plate 80 is disposed on the upper surface of the light adjustment member 31 and the first upper surface 20a of the light-transmissive member 20 with a light-transmissive adhesive member or the like interposed therebetween, for example. Alternatively, the light adjustment member 30 and the light-transmissive member 20 may be formed using a resin and joined to the light-transmissive plate 80 by using the tackiness of the resin.

Sixth Embodiment

Figure 6:
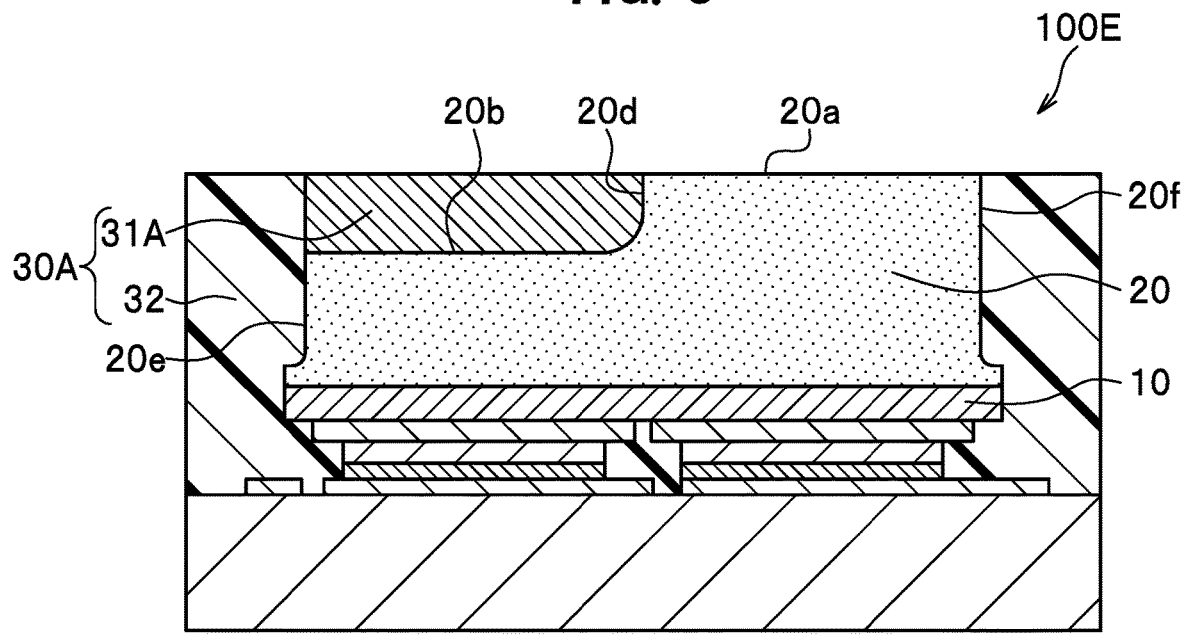
FIG. 6 is a schematic sectional view illustrating a light-emitting device according to a sixth embodiment.

FIG. 6 is a schematic sectional view illustrating a light-emitting device according to a sixth embodiment.

The configuration of a light-emitting device 100E differs from that of the light-emitting device 100 of the first embodiment in that a light adjustment member 31A is an inorganic member containing a light reflective material.

The light-emitting device 100E includes a light adjustment member 30A including the first light adjustment member 31A that covers the second upper surface 20b and the first lateral surface 20d of the light-transmissive member 20, and the second light adjustment member 32 that exposes the upper surface of the first light adjustment member 31A and the first upper surface 20a of the light-transmissive member 20 and covers the lateral surface of the first light adjustment member 31A, the second lateral surface 20e and the third lateral surface 20f of the light-transmissive member 20, and the lateral surface of the light-emitting element 10. In the light adjustment member 30A, the first light adjustment member 31A is formed of an inorganic member, and the second light adjustment member 32 is formed of a resin, for example. Examples of the inorganic member include glass and ceramic.

With the first light adjustment member 31A formed of the inorganic member, the light-emitting device 100E has better reliability. In addition, in the light-emitting device 100E, it is easy to recognize the position of the light-emitting region R including the second light-emitting region R2 in the non-light emission period of the light-emitting device because the boundary between the first light adjustment member 31A and the second light adjustment member 32 is easily visually recognized. Thus, it is easy to perform alignment with an optical system.

The light-emitting device 100E can be manufactured in such a manner that after the light-transmissive member 200 joined to the support substrate 15 is processed, the first light adjustment member 31A is disposed and thereafter singulation is performed to divide the light-emitting element 10 to which the light-transmissive member 20 is joined, for example.

Seventh Embodiment

Figure 7:
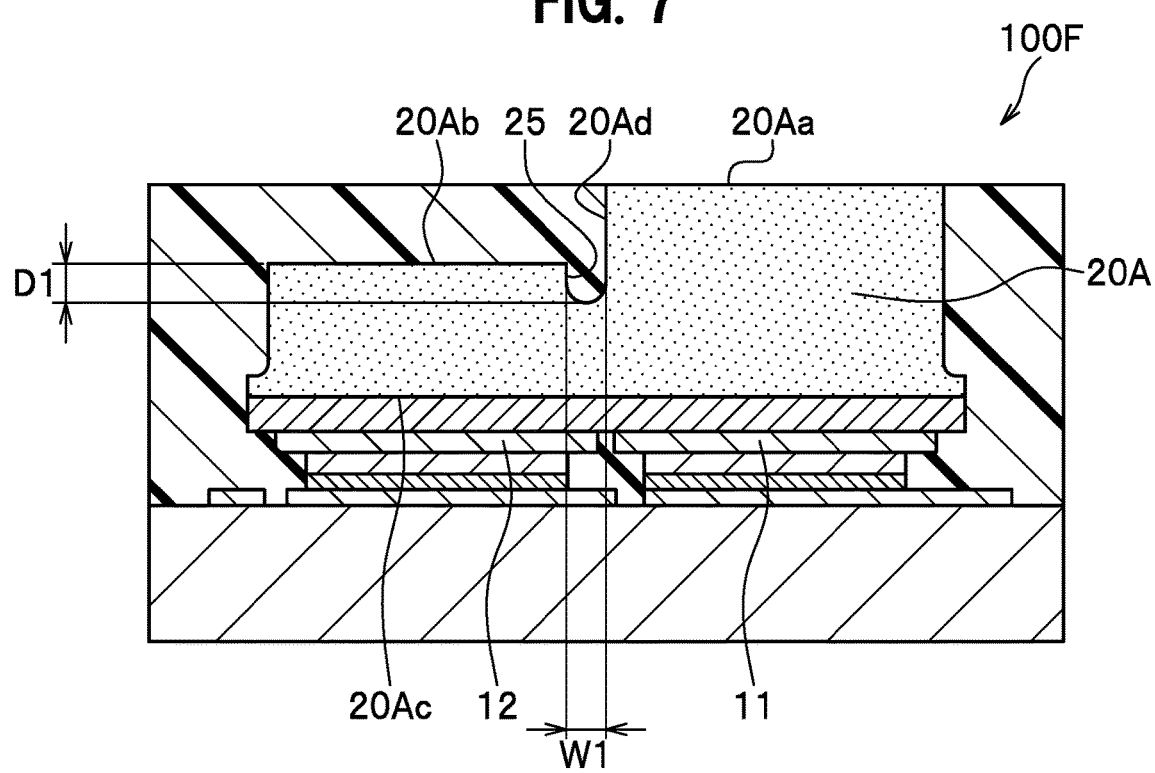
FIG. 7 is a schematic sectional view illustrating a light-emitting device according to a seventh embodiment.

FIG. 7 is a schematic sectional view illustrating a light-emitting device according to a seventh embodiment.

The configuration of a light-emitting device 100F differs from that of the light-emitting device 100 of the first embodiment in that a second upper surface 20Ab of the light-transmissive member 20A has a recessed portion 25 between the second upper surface 20Ab and a first lateral surface 20Ad and that the first lateral surface 20Ad partially defines the lateral surface of the recessed portion 25.

The light-emitting device 100F has the recessed portion 25 on the first lateral surface 20Ad side in the second upper surface 20Ab of the light-transmissive member 20A. With the recessed portion 25 provided in the light-transmissive member 20A, the boundary between the first light-emitting region R1 and the second light-emitting region R2 can be more clarified. Further, in plan view, allowing the recessed portion 25 to be located between the first light-emitting portion 11 and the second light-emitting portion 12 can suppress uneven chromaticity at the boundary between the first light-emitting region R1 and the second light-emitting region R2.

A depth D1 of the recessed portion 25 (i.e., the difference between the thickness from a lower surface 20Ac to the second upper surface 20Ab and the thickness from the lower surface 20Ac to the bottom of the recessed portion 25) is in a range from 5 μm to 45 μm, for example.

A width W1 of the recessed portion 25 (i.e., the length in the direction from a first upper surface 20Aa toward the second upper surface 20Ab) is in a range from 25 μm to 50 μm, for example.

Eighth Embodiment and Ninth Embodiment

Figure 8A:
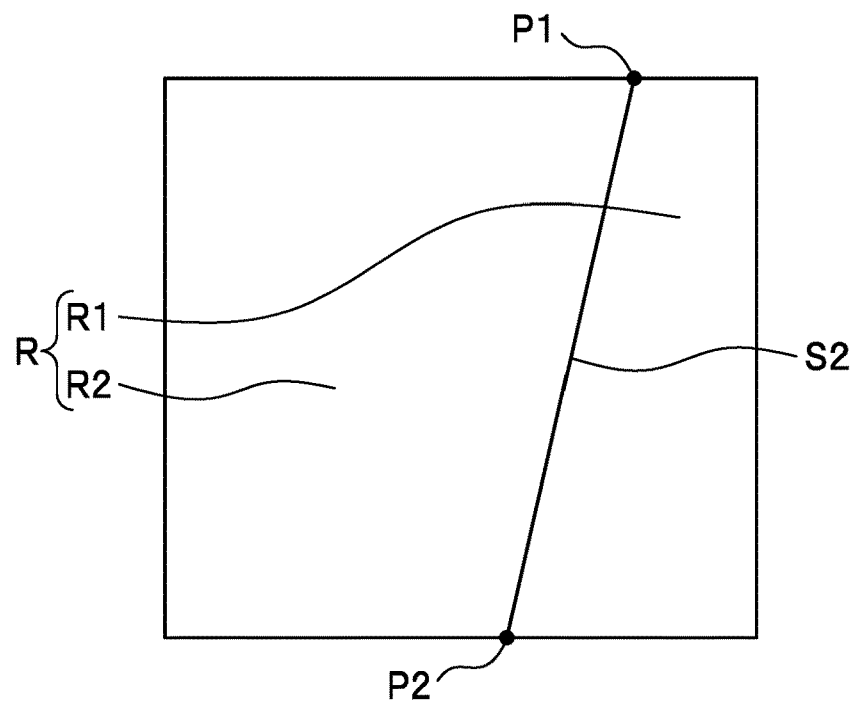
FIG. 8A is a schematic plan view for showing a shape of a light-emitting region of a light-emitting device according to an eighth embodiment.
Figure 8B:
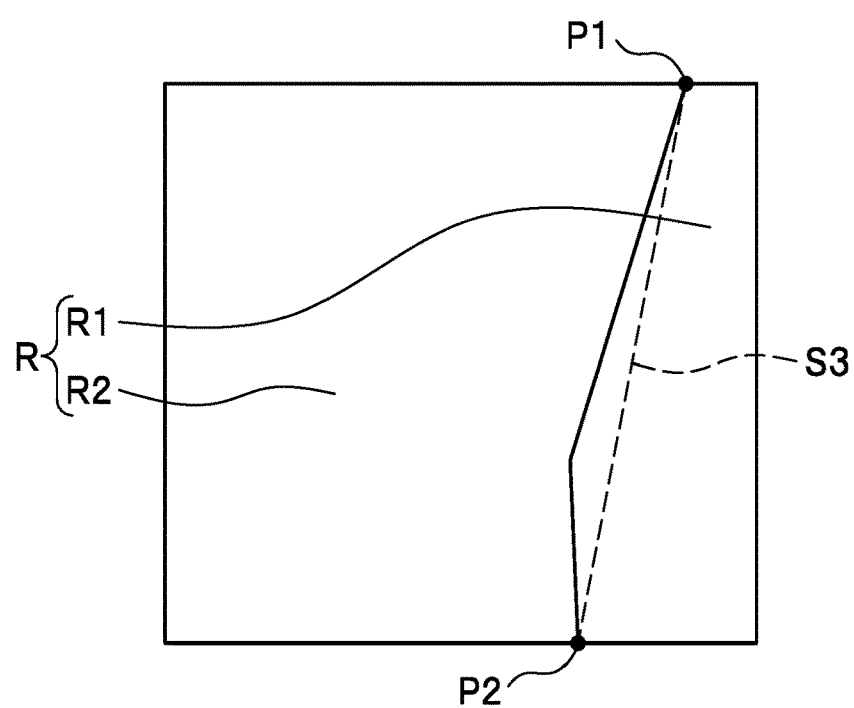
FIG. 8B is a schematic plan view for showing a shape of a light-emitting region of a light-emitting device according to a ninth embodiment.

FIG. 8A is a schematic plan view for showing a shape of a light-emitting region of a light-emitting device according to an eighth embodiment. FIG. 8B is a schematic plan view for showing a shape of a light-emitting region of a light-emitting device according to a ninth embodiment.

The configuration of the light-emitting device of the eighth embodiment differs from that of the light-emitting device 100 of the first embodiment in the positions of the first point P1 and the second point P2 on the boundary between the first light-emitting region R1 and the second light-emitting region R2.

The first point P1 and the second point P2 are shifted to the first light-emitting region R1 side from the center on respective sides of the light-emitting region R in plan view. In addition, the first point P1 is more shifted to the first light-emitting region R1 side than the second point P2 is. Thus, a straight line S2 connecting the first point P1 and the second point P2 obliquely extends across the light-emitting region R from the upper right to the lower right in the drawing. Note that the area of the second light-emitting region R2 is larger than the area of the first light-emitting region R1. In addition, the light-emitting region R is formed such that the boundary between the first light-emitting region R1 and the second light-emitting region R2 overlaps the straight line S2.

The configuration of the light-emitting device of the ninth embodiment differs from that of the light-emitting device of the eighth embodiment in that the positions of the first point P1 and the second point P2 on the boundary between the first light-emitting region R1 and the second light-emitting region R2 are more shifted to the first light-emitting region R1 side, and that the boundary between the first light-emitting region R1 and the second light-emitting region R2 does not overlap the straight line S3 extending across the light-emitting region R.

The boundary between the first light-emitting region R1 and the second light-emitting region R2 defines the first light-emitting region R1 and the second light-emitting region R2 with two straight lines.

The eighth and ninth embodiments can also achieve a light-emitting device including a high luminance region in the light-emitting surface. In addition, the chromaticity difference between the light emitted from the first light-emitting region R1 side and the light emitted from the second light-emitting region R2 side can be reduced, and the uneven chromaticity on the light-emitting surface of the light-emitting device can be improved.

Tenth Embodiment

Figure 9:
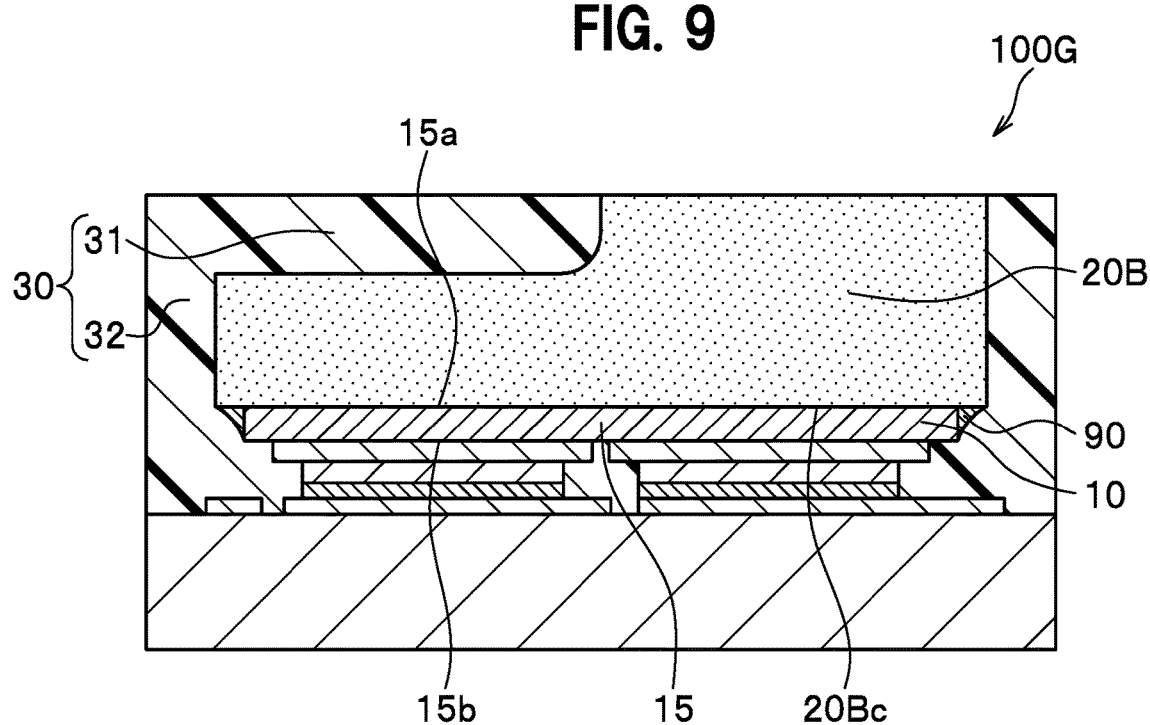
FIG. 9 is a schematic sectional view illustrating a light-emitting device according to a tenth embodiment.

FIG. 9 is a schematic sectional view illustrating a light-emitting device according to a tenth embodiment.

The configuration of a light-emitting device 100G differs from that of the light-emitting device 100 of the first embodiment in that the protruding portions 23 and 24 are not provided, that a lower surface 20Bc of a light-transmissive member 20B is larger than the first surface 15a of the support substrate 15, and that a light guide member 90 is provided.

In the light-transmissive member 20B, the lower surface 20Bc larger than the first surface 15a of the support substrate 15 is joined to the first surface 15a of the support substrate 15. Specifically, the light-transmissive member 20B having the outer edge located outward from the outer edge of the light-emitting element 10 in plan view is disposed.

The light guide member 90 is a member that guides light from the light-emitting element 10 to the light-transmissive member 20B. The light guide member 90 covers the lateral surface of the support substrate 15. The light guide member 90 may be an adhesive member that bonds the light-emitting element 10 and the light-transmissive member 20B and extends to the lateral surface of the support substrate 15, for example. In this case, the light guide member 90 with a predetermined thickness may be disposed between the support substrate 15 and the light-transmissive member 20B. In addition, the light guide member 90 may be a member different from the adhesive member of the light-emitting element 10 and the light-transmissive member 20B.

In the shape of the light guide member 90 in sectional view, for example, the lateral surface is curved and tilted such that the width increases from the second surface 15b side of the support substrate 15 toward the lower surface 20Bc side of the light-transmissive member 20B. The cross-sectional shape of the lateral surface of the light guide member 90 may be a straight shape, or a curved shape. For example, in the case in which the lateral surface of the light guide member 90 in sectional view is a curved shape, the curved shape may be a curved shape recessed toward the light adjustment member 30 side, or a curved shape recessed toward the support substrate 15 side. Further, the lateral surface of the light guide member 90 may have a shape with a portion recessed toward the light adjustment member 32 side and a portion recessed toward the support substrate 15 side.

As the light guide member 90, a light-transmissive resin may be used, for example. As the light guide member 90, an organic resin such as an epoxy resin, a silicone resin, a phenol resin, or a polyimide resin may be used, for example. In particular, a silicone resin, which has a high heat resistance, is preferably used. The above-described light diffusion member or phosphor can also be contained in the light guide member 90.

Eleventh Embodiment

Figure 10:
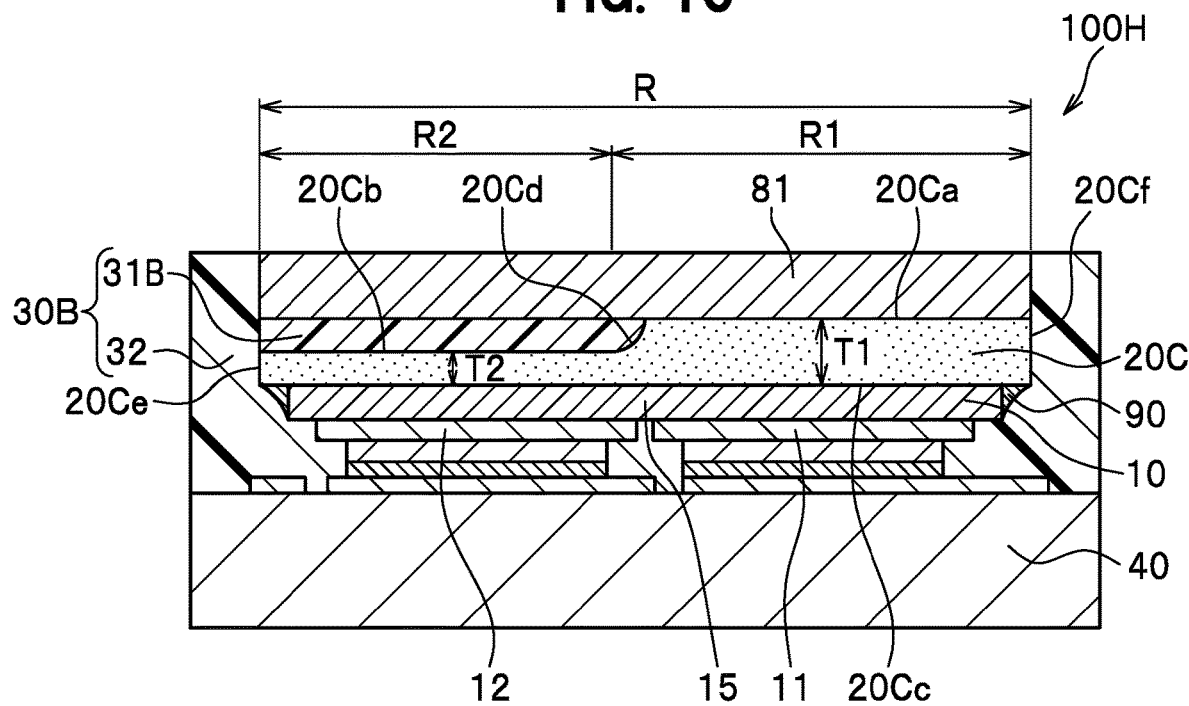
FIG. 10 is a schematic sectional view illustrating a light-emitting device according to an eleventh embodiment.

FIG. 10 is a schematic sectional view illustrating a light-emitting device according to an eleventh embodiment.

The configuration of a light-emitting device 100H differs from that of the light-emitting device 100G of the tenth embodiment in that (i) a light-transmissive plate 81 is disposed on a first upper surface 20Ca of a light-transmissive member 20C, and (ii) as a light adjustment member 30B, a first light adjustment member 31B that covers a second upper surface 20Cb of the light-transmissive member 20C and the second light adjustment member 32 that covers the lateral surface of the light-transmissive plate 81 are provided.

The light-emitting device 100H includes the light-emitting element 10, the light-transmissive member 20C, the first light adjustment member 31B, and the light-transmissive plate 81. The light-transmissive member 20C has the first upper surface 20Ca, the second upper surface 20Cb, and a lower surface 20Cc located on the side opposite to the first upper surface 20Ca and the second upper surface 20Cb. The first upper surface 20Ca and the second upper surface 20Cb are contiguous through a first lateral surface 20Cd. The light-transmissive member 20C is disposed on the light-emitting element 10 with the lower surface 20Cc facing the support substrate 15 of the light-emitting element 10. In the light-transmissive member 20C, the thickness T1 from the lower surface 20Cc to the first upper surface 20Ca is larger than the thickness T2 from the lower surface 20Cc to the second upper surface 20Cb. The first light adjustment member 31B exposes the first upper surface 20Ca of the light-transmissive member 20C and covers the second upper surface 20Cb and the first lateral surface 20Cd. The light-transmissive plate 81 covers the first upper surface 20Ca of the light-transmissive member 20C and the upper surface of the first light adjustment member 31B. In the light-emitting device 100H, the first light adjustment member 31B is disposed between the second upper surface 20Cb of the light-transmissive member 20C and the light-transmissive plate 81. Preferably, the first light adjustment member 31B is disposed in contact with the light-transmissive member 20C and the light-transmissive plate 81 between the second upper surface 20Cb of the light-transmissive member 20C and the light-transmissive plate 81.

Preferably, the thickness T1 from the lower surface 20Cc to the first upper surface 20Ca in the light-transmissive member 20C is 10 μm or larger in view of improvement of the mechanical strength, and 200 μm or smaller in view of reduction in size of the light-emitting device 100H. In more particular, the thickness T1 from the lower surface 20Cc to the first upper surface 20Ca is more preferably in a range from 15 μm to 150 μm, still more preferably in a range from 20 μm to 120 μm.

Preferably, the thickness T2 from the lower surface 20Cc to the second upper surface 20Cb in the light-transmissive member 20C is smaller than the thickness T1, and is in a range from 10 μm to 200 μm in view of the improvement of the mechanical strength and reduction in size, as with the thickness T1. I thickness T2 is more preferably in a range from 10 μm to 105 μm, still more preferably in a range from 15 μm to 90 μm. The difference between the thickness T1 from the lower surface 20Cc to the first upper surface 20Ca and the thickness T2 from the lower surface 20Cc to the second upper surface 20Cb in the light-transmissive member 20C (i.e., the thickness of the first light adjustment member 31B that covers the second upper surface 20Cb) can be adjusted as necessary in accordance with the desired light distribution. For example, in the case in which the luminance of the second light-emitting region R2 is set in a range from 5% to 80% of the luminance of the first light-emitting region R1, the thickness T2 at the second upper surface 20Cb of the light-transmissive member 20C is in a range from 20% to 90% of the thickness T1 at the first upper surface 20Ca of the light-transmissive member 20C, for example.

The light-emitting device 100H may further include, as the light adjustment member 30B, the second light adjustment member 32 that exposes the upper surface of the light-transmissive plate 81 and covers the lateral surface of the light-transmissive plate 81, the lateral surface of the first light adjustment member 31B, a second lateral surface 20Ce and a third lateral surface 20Cf of the light-transmissive member 20C, and the lateral surface of the light-emitting element 10. The second light adjustment member 32 covers the lateral surface of the support substrate 15 directly or with another member such as the light guide member 90 interposed therebetween.

In the light-emitting device 100H, the light-transmissive member 20C is a resin containing phosphor powder, and the first light adjustment member 31B and the second light adjustment member 32 are a resin containing light reflective material particles. By using a resin as the base material of the light-transmissive member 20C, the first light adjustment member 31B, and the second light adjustment member 32, the concentration and the like of the phosphor powder and/or the light reflective material contained in each of the members can be easily adjusted, and the luminance and chromaticity of light emitted from each of the light-emitting regions can be easily adjusted.

In the light-emitting device 100H, phosphor contained in the light-transmissive member 20C can be dispersed in the light-transmissive member 20Cc, or locally disposed on the lower surface 20c side (i.e., the light-emitting element 10 side). Even in the case in which the phosphor is locally disposed on the lower surface side in the light-transmissive member 20C, the amount of phosphor disposed between the lower surface 20Cc and the second upper surface 20Cb can be less than the amount of phosphor disposed between the lower surface 20Cc and the first upper surface 20Ca. This can reduce the chromaticity difference between the light emitted from the first light-emitting region R1 side and the light emitted from the second light-emitting region R2 side.

The light-transmissive plate 81 is disposed on the first upper surface 20Ca of the light-transmissive member 20C and the upper surface of the first light adjustment member 31B. Thus, the first light adjustment member 31B and the light-transmissive member 20C can be protected, the degradation of the first light adjustment member 31B and the light-transmissive member 20C can be suppressed, and the light-emitting surface can be protected.

Preferably, the thickness of the light-transmissive plate 81 is 20 µm or larger in view of improvement of the mechanical strength, and 300 µm or smaller in view of reduction in the size of the light-emitting device 100H. In addition, preferably, in the case in which each of the first light adjustment member 31B and the light-transmissive member 20C is formed of a resin member, the thickness of the light-transmissive plate 81 as a support for supporting the resin member is larger than the thickness of the light-transmissive member 20C. Note that the thickness of the light-transmissive plate 81 is the thickness in the direction perpendicular to the upper surface of the wiring substrate 40 or the upper surface of the light-emitting element 10. The material of the light-transmissive plate 81 may be the same material as that of the light-transmissive plate 80, for example.

Twelfth Embodiment

Figure 11:
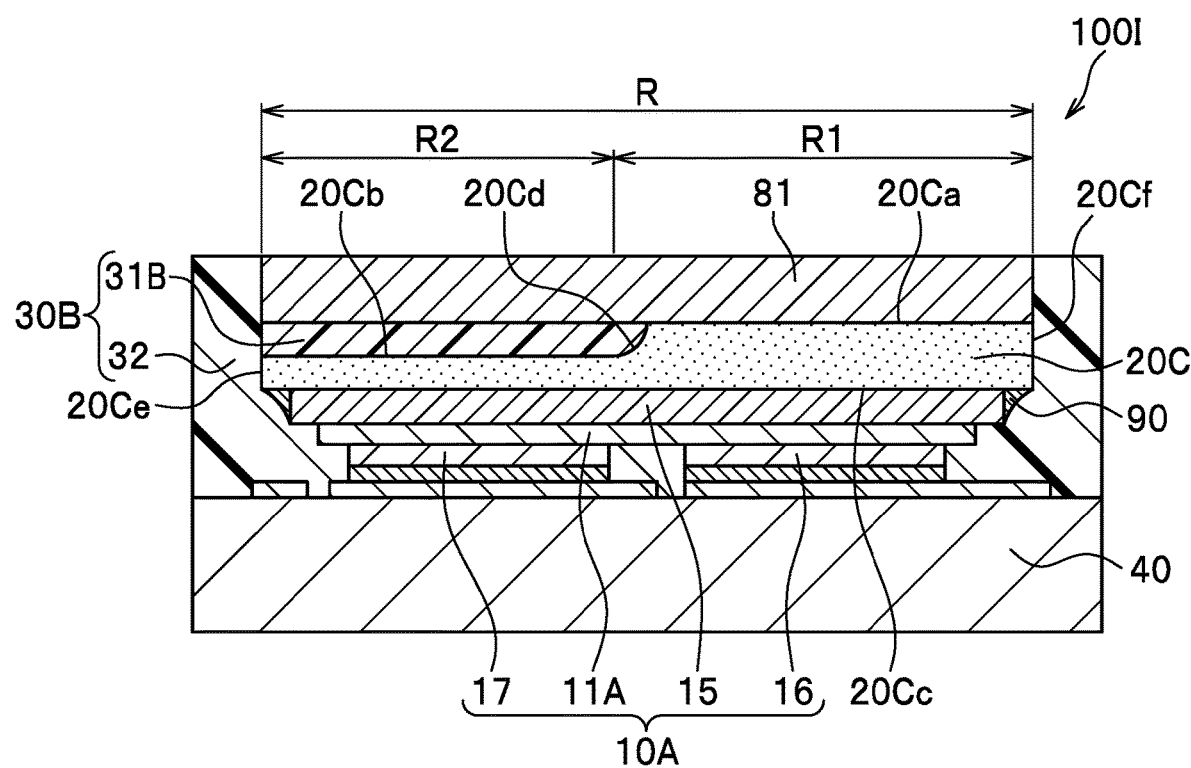
FIG. 11 is a schematic sectional view illustrating a light-emitting device according to a twelfth embodiment.

FIG. 11 is a schematic sectional view illustrating a light-emitting device according to a twelfth embodiment.

The configuration of a light-emitting device 100I differs from that of the light-emitting device 100H of the eleventh embodiment in that the light-emitting element 10A includes only one light-emitting portion 11A.

The light-emitting device 100I can have a luminance difference in the light-emitting region R and have improved reliability.

The eleventh and twelfth embodiments can also achieve a light-emitting device including a high luminance region in the light-emitting surface. In addition, the chromaticity difference between the light emitted from the first light-emitting region R1 side and the light emitted from the second light-emitting region R2 side can be reduced, and the uneven chromaticity on the light-emitting surface of the light-emitting device can be improved.

The light-emitting device according to the present embodiment and the method for manufacturing the light-emitting device have been specifically described above by means of the embodiments for carrying out the invention, but the spirit of the present invention is not limited to these descriptions and should be interpreted broadly based on the appended claims. Various modifications, variations, and the like based on these descriptions are also included within the spirit of the present invention. Further, the aforementioned embodiments may be implemented in combination with each other.

For example, the first light-emitting portion and the second light-emitting portion may have the same current density during light emission, or have different current densities during light emission. When the current density of the current passing through the light-emitting layer of the first light-emitting portion and the current density of the current passing through the light-emitting layer of the second light-emitting portion are different from each other, the luminance difference between the low luminance and the high luminance can be adjusted. The first light-emitting portion and the second light-emitting portion can have different current densities during light emission by using a wiring substrate that can separately drive the first light-emitting portion and the second light-emitting portion. In addition, even in the case in which the wiring substrate includes a wiring that connects the first light-emitting portion and the second light-emitting portion in series, the first light-emitting portion and the second light-emitting portion can have different current densities during light emission when having different areas (dimensions) in plan view. When the first light-emitting portion and the second light-emitting portion have the same area (dimensions) in plan view, a wiring substrate provided with a wiring that connects the first light-emitting portion and the second light-emitting portion in series may be provided with a constant-current diode to make the first light-emitting portion and the second light-emitting portion have different current densities during light emission. Even when the first light-emitting portion and the second light-emitting portion have different areas (dimensions) in plan view, the first light-emitting portion and the second light-emitting portion may be individually driven to have different current densities during light emission.

In addition, the light-emitting element may include a plurality of light-emitting portions including the first light-emitting portion and the second light-emitting portion, or may include one light-emitting portion. In addition, the number of element electrodes disposed on one light-emitting portion may be two, or four or more. One light-emitting portion may include a plurality of semiconductor layered bodies disposed in an overlapping manner. The light-transmissive member may have a layered structure with two or more layers. In this case, the phosphor concentration may be set as the ratio of the amount of the phosphor to the total amount of all layers containing the phosphor in the light-transmissive member.

In the light-emitting device, a reflection film such as a dielectric multilayer film may be disposed on the light-transmissive member 20 and/or the upper surface of the light-transmissive plate 80 in the light-emitting region R. In that case, the luminance and luminous intensity of the light emitted from the first light-emitting region R1 and/or the second light-emitting region R2 can be more easily adjusted.

Furthermore, in the method for manufacturing the light-emitting device, the order of some steps is not limited, and the order can be reversed. For example, after a light-emitting element to which a light-transmissive member having a plate shape (i.e., having no second upper surface) is joined is formed through division of a semiconductor wafer to which one light-transmissive member is joined, this light-emitting element may be disposed on a wiring substrate, and then processing such as forming a first upper surface and a second upper surface in the light-transmissive member may be performed. Alternatively, before a light-emitting element to which a light-transmissive member having a plate shape (i.e., having no second upper surface) is joined is disposed on a wiring substrate, processing such as forming a first upper surface and a second upper surface in the light-transmissive member joined to the light-emitting element may be performed, and then the light-emitting element may be disposed on the wiring substrate.

After a light-transmissive member joined to a semiconductor wafer is processed, a light adjustment member may be disposed, and then the light-transmissive member on which the light adjustment member is disposed may be divided for singulation. After a light-emitting element is disposed on a wiring substrate and an individual light-transmissive member obtained by singulation is disposed on the light-emitting element disposed on the wiring substrate, a light adjustment member may be disposed.

The light-emitting devices according to the embodiments of the present disclosure are as follows, for example.

Aspect 1

A light-emitting device including, on an upper surface, a light-emitting region including a first light-emitting region and a second light-emitting region disposed next to the first light-emitting region, the light-emitting device including a light-emitting element including: a support substrate having a first surface and a second surface located on a side opposite to the first surface; and a light-emitting portion located on the second surface of the support substrate and including a semiconductor layered body including a first semiconductor layer, a light-emitting layer and a second semiconductor layer in this sequence; a light-transmissive member having: a first upper surface, a second upper surface, a lower surface located on a side opposite to the first upper surface and the second upper surface, and facing the first surface of the support substrate of the light-emitting element, a first lateral surface contiguous with the first upper surface and the second upper surface, a second lateral surface contiguous with the second upper surface and the lower surface, and a third lateral surface contiguous with the first upper surface and the lower surface; and a light adjustment member exposing the first upper surface of the light-transmissive member and covering the second upper surface and the first lateral surface of the light-transmissive member, wherein the light-transmissive member has a thickness from the lower surface to the first upper surface larger than a thickness from the lower surface to the second upper surface, in a plan view, the first light-emitting region has the first upper surface of the light-transmissive member, the second light-emitting region includes the second upper surface of the light-transmissive member, and an area of the second light-emitting region is in a range from 35% to 95% of an area of the light-emitting region, and a boundary between the first light-emitting region and the second light-emitting region includes a first point and a second point on a perimeter of the light-emitting region, and a straight line connecting the first point and the second point extends across the light-emitting region in the plan view.

Aspect 2

The light-emitting device according to aspect 1, wherein the light-emitting element further includes an additional light-emitting portion spaced apart from the light-emitting portion on the second surface of the support substrate.

Aspect 3

The light-emitting device according to aspect 2, wherein in the plan view, the boundary between the first light-emitting region and the second light-emitting region is located between the light-emitting portion and the additional light-emitting portion.

Aspect 4

The light-emitting device according to aspect 2 or 3, wherein the light-emitting portion and the additional light-emitting portion are different from each other in a current density during light emission.

Aspect 5

The light-emitting device according to any one of aspects 1 to 3, wherein the light-transmissive member contains a phosphor.

Aspect 6

The light-emitting device according to aspect 5, wherein the light adjustment member contains a phosphor that differs in light emission peak wavelength from the phosphor contained in the light-transmissive member.

Aspect 7

The light-emitting device according to any one of aspects 1 to 6, wherein the light adjustment member is a resin member containing a light reflective material.

Aspect 8

The light-emitting device according to any one of aspects 1 to 7, wherein the light adjustment member covers the second lateral surface and the third lateral surface of the light-transmissive member and a lateral surface of the light-emitting element.

Aspect 9

The light-emitting device according to any one of aspects 1 to 6, wherein the light adjustment member is an inorganic member containing a light reflective material.

Aspect 10

The light-emitting device according to aspect 9, further including an additional light adjustment member exposing an upper surface of the light adjustment member and the first upper surface of the light-transmissive member and covering a lateral surface of the light adjustment member, the second lateral surface and the third lateral surface of the light-transmissive member, and a lateral surface of the light-emitting element.

Aspect 11

The light-emitting device according to any one of aspects 1 to 10, wherein the first upper surface of the light-transmissive member and the upper surface of the light adjustment member are flush with each other.

Aspect 12

The light-emitting device according to any one of aspects 1 to 11, further including a light-transmissive plate covering the upper surface of the light adjustment member.

Aspect 13

The light-emitting device according to any one of aspects 1 to 12, wherein a surface roughness Ra of the second upper surface of the light-transmissive member is greater than a surface roughness Ra of the first upper surface of the light-transmissive member.

Aspect 14

The light-emitting device according to any one of aspects 1 to 13, wherein in the light-transmissive member, the second upper surface includes a curved surface portion contiguous with the first lateral surface.

Aspect 15

The light-emitting device according to any one of aspects 1 to 13, wherein, in the light-transmissive member, the second upper surface has a recessed portion contiguous with the first lateral surface such that the first lateral surface partially defines a lateral surface of the recessed portion.

Aspect 16

The light-emitting device according to any one of aspects 1 to 15, wherein the light-emitting portion includes an additional semiconductor layered body overlapping the semiconductor layered body.

The light-emitting devices according to the embodiments of the present disclosure can be preferably utilized for vehicle lighting such as headlights. In addition, the light-emitting devices according to the embodiments of the present disclosure can be utilized for the light source for a backlight of a liquid crystal display, various types of lighting fixtures, a large display, various types of display devices for advertisements, destination information, and the like, and further, a digital video camera, image reading devices in a facsimile, a copy machine, a scanner, and the like, and a projector device, for example.

What is claimed is:

1. A light-emitting device comprising:
   a light-emitting element including
      a support substrate having a first surface and a second surface located on a side opposite to the first surface, and
      a light-emitting portion located on the second surface of the support substrate and including a semiconductor layered body including a first semiconductor layer, a light-emitting layer and a second semiconductor layer in this sequence;
   a light-transmissive member having
      a first upper surface,
      a second upper surface,
      a lower surface located on a side opposite to the first upper surface and the second upper surface, and facing the first surface of the support substrate of the light-emitting element,
      a first lateral surface contiguous with the first upper surface and the second upper surface,
      a second lateral surface contiguous with the second upper surface and the lower surface, and
      a third lateral surface contiguous with the first upper surface and the lower surface; and
   a first light adjustment member exposing the first upper surface of the light-transmissive member and covering the second upper surface and the first lateral surface of the light-transmissive member, wherein
      the light-transmissive member and the first light adjustment member collectively define a rectangular cross-sectional shape.

2. The light-emitting device according to claim 1, further comprising
   a second light adjustment member exposing an upper surface of the first light adjustment member and the first upper surface of the light-transmissive member, and covering a lateral surface of the first light adjustment member, the second lateral surface and the third lateral surface of the light-transmissive member, and a lateral surface of the light-emitting element.

3. The light-emitting device according to claim 1, further comprising
   a light-transmissive plate covering an upper surface of the first light adjustment member and the first upper surface of the light-transmissive member.

4. The light-emitting device according to claim 3, wherein the second light adjustment member covers a lateral surface of the light-transmissive plate.

5. The light-emitting device according to claim 1, wherein the first light adjustment member is a resin member containing a light reflective material.

6. The light-emitting device according to claim 1, wherein the light-transmissive member contains a phosphor.

7. The light-emitting device according to claim 1, wherein the light-transmissive member is a resin member containing a phosphor.

8. The light-emitting device according to claim 1, wherein the light-transmissive member is an inorganic member containing a phosphor.

9. The light-emitting device according to claim 1, wherein the light-emitting element further includes an additional light-emitting portion spaced apart from the light-emitting portion on the second surface of the support substrate.

10. The light-emitting device according to claim 9, wherein
    in the plan view, the boundary between the first light-emitting region and the second light-emitting region is located between the light-emitting portion and the additional light-emitting portion.

11. The light-emitting device according to claim 1, wherein
    the first light adjustment member contains a phosphor that differs in light emission peak wavelength from the phosphor contained in the light-transmissive member.

12. The light-emitting device according to claim 1, wherein
    the first upper surface of the light-transmissive member and an upper surface of the first light adjustment member are flush with each other.

13. The light-emitting device according to claim 1, wherein
    in the light-transmissive member, the second upper surface includes a curved surface portion contiguous with the first lateral surface.

14. The light-emitting device according to claim 1, wherein
    in the light-transmissive member, the second upper surface has a recessed portion contiguous with the first lateral surface such that the first lateral surface partially defines a lateral surface of the recessed portion.

* * * * *